United States Patent
Vyas et al.

(10) Patent No.: US 12,249,577 B2
(45) Date of Patent: Mar. 11, 2025

(54) CAP STRUCTURE FOR INTERCONNECT DIELECTRICS AND METHODS OF FABRICATION

(71) Applicant: Intel Corporation, Santa Clara, CA (US)

(72) Inventors: Shashi Vyas, Hillsboro, OR (US); Sudipto Naskar, Portland, OR (US); Charles Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 17/125,680

(22) Filed: Dec. 17, 2020

(65) Prior Publication Data

US 2022/0199544 A1    Jun. 23, 2022

(51) Int. Cl.
| | |
|---|---|
| *H01L 23/532* | (2006.01) |
| *H01L 21/768* | (2006.01) |
| *H01L 23/522* | (2006.01) |
| *H01L 23/528* | (2006.01) |

(52) U.S. Cl.
CPC .. *H01L 23/53295* (2013.01); *H01L 21/76831* (2013.01); *H01L 21/76832* (2013.01); *H01L 23/5226* (2013.01); *H01L 23/5283* (2013.01)

(58) Field of Classification Search
None
See application file for complete search history.

(56) References Cited

U.S. PATENT DOCUMENTS

| | | |
|---|---|---|
| 2010/0248473 A1 | 9/2010 | Ishizaka et al. |
| 2014/0217592 A1 | 8/2014 | Ou et al. |
| 2019/0181088 A1* | 6/2019 | Lee ............... H01L 21/76837 |
| 2019/0295890 A1 | 9/2019 | Clark et al. |
| 2020/0118926 A1 | 4/2020 | Lee et al. |
| 2020/0343445 A1 | 10/2020 | Strutt et al. |

OTHER PUBLICATIONS

International Search Report and Written Opinion from PCT/US2021/051145 notified Jan. 7, 2022, 12 pgs.
International Preliminary Report on Patentability from PCT/US2021/051145 notified Jun. 29, 2023, 8 pgs.

* cited by examiner

*Primary Examiner* — Zandra V Smith
*Assistant Examiner* — Molly K Reida
(74) *Attorney, Agent, or Firm* — Essential Patents Group, LLP

(57) ABSTRACT

An integrated circuit structure includes a first interconnect level including a first dielectric between a pair of interconnect structures, a second interconnect level above the first interconnect level. The second interconnect level includes a cap structure including a second dielectric on the first dielectric, the cap structure includes a top surface and a sidewall surface and a liner comprising a third dielectric on the top surface and on the sidewall surface.

20 Claims, 14 Drawing Sheets

CAP STRUCTURE FOR INTERCONNECT DIELECTRICS AND METHODS OF FABRICATION

BACKGROUND

Generally, integrated circuit structures such as vias and interconnects connect two or more circuit elements such as transistors, memory devices, diodes together. Every semiconductor device requires electrical routing through a variety of interconnect structures for operation. As transistors, capacitors and memory devices, for example, are scaled in feature size, interconnect structures are also scaled in proportion. However, misalignment between interconnect structures due to lithographic misalignment, for example, can lead to undesirable device degradation such as added capacitance or cross talk. Therefore, there is a continuing need for improving interconnect routing with feature size scaling.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
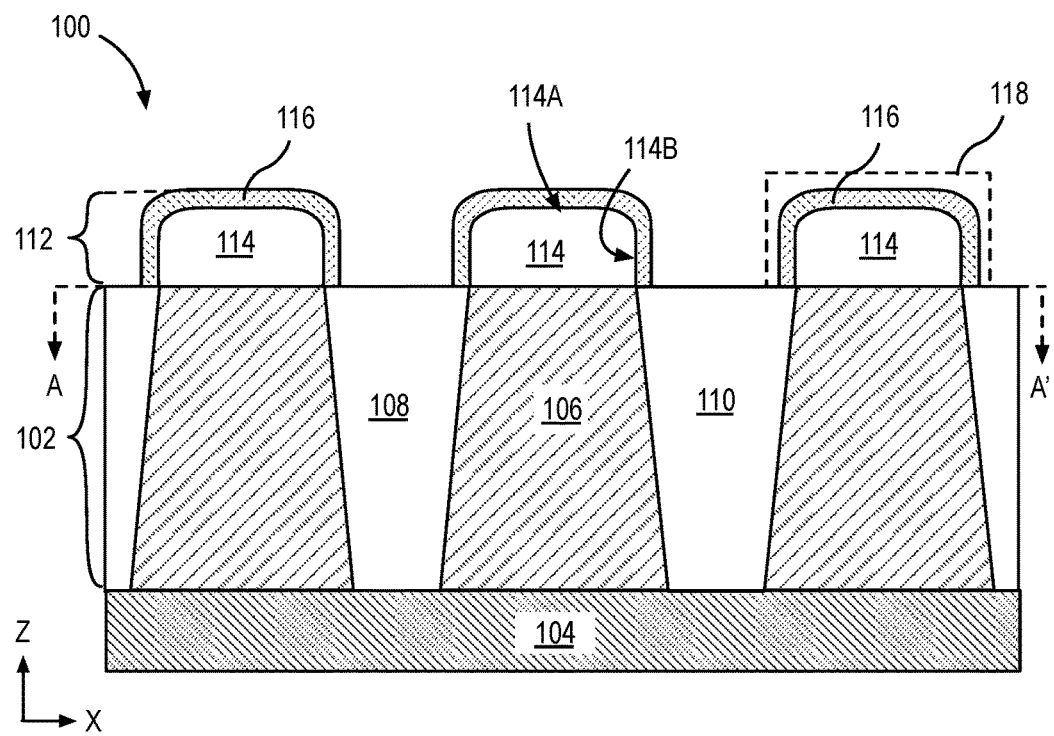
FIG. 1A illustrates a cross-sectional view of a pair of interconnect structures separated by a dielectric structure, in accordance with an embodiment of the present disclosure.

Cap structure for interconnect dielectrics and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as device operations, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Self-aligned vias are utilized in a variety of integrated circuit structure applications for eliminating shorting between metal lines (interconnects) and vias. As lateral width of metal lines and space between them continue to shrink, implementing self-aligned vias can be challenging. For example, when metal lines are scaled aggressively to a 1:1 line-space, margin for misalignment between vias and lines are also reduced. Issues arising from misalignment are multi-pronged. In embodiments, a plasma etch process is utilized to form via openings to expose metal lines. In most examples, the via openings have either a uniform width along a depth of the via opening with a narrow portion at the bottom, or the via openings are gradually tapered at the bottom to enable metal filling. Typically etch stop layers are implemented to prevent punch through during the via opening process and include materials that have slower etch rates compared to an ILD that is etched to form the via opening.

In examples where metal lines and intervening ILD are each 15 nm wide (1:1 line-space ratio for example), the lowermost portion of a via is typically less than 15 nm wide. In some such embodiments, misalignment between a via opening and a metal line may lead to variety of issues. Misalignment between via opening and via can lead to reduction in overlap area between via opening and the metal line. Consequently, a conductive via (herein via) formed in the opening can lead to increase in line resistance. Furthermore, when vias are misaligned with respect to metal lines, the distance between a misaligned via and a nearest neighboring metal line (not in contact with the via) can lead to cross talk. Another potential issue is that line edge roughness of metal lines can adversely promote shorting and increase cross talk. Because a lateral spacing between a via and a nearest neighboring line is dominated by a shortest distance between them, line edge roughness of the metal line can exacerbate the problem.

Solutions for reducing cross talk include recessing uppermost surfaces of metal lines with respect to an uppermost surface of an intervening interlayer dielectric (ILD). A recessed metal surface, for example, can increase a distance between a nearest neighboring metal line and a misaligned via. Increasing separation between a misaligned via and a neighboring metal line reduces an effective capacitance. However, selectively and controllably recessing metal lines requires not only recessing a fill metal component of the metal lines but also reducing an adjacent metal liner. In most examples, such recessing techniques produce non uniform results.

Solutions to eliminate shorting include selectively growing a liner on an uppermost surface of an intervening ILD and not on the metal lines. In some such examples, the etch stop layer is formed on the liner. When uppermost surface of the ILD is substantially co-planar with uppermost surface of the metal lines, a controlled liner growth can result in a uniform vertical separation between the uppermost surfaces of the metal lines and the ILD. In various implementations, the liner includes a dielectric material, such as an insulative metal oxide, that is primarily designed to provide etch selectivity during subsequent via etch. However, materials that provide etch selectivity, for example, oxides of metals such as hafnium, aluminum zirconium etc, also have high dielectric constants. Thus, while implementing a liner can sufficiently prevent etch punch through, the choice of materials selected can also adversely promote increased capacitance following formation of vias above the metal lines. While the liner increases a distance between uppermost surface of a nearest neighboring metal and a misaligned via, a higher dielectric constant material can lead to electric field enhancement in the vicinity of the via and the metal lines. In exemplary embodiments, the liner has a thickness between 1 nm-2 nm.

The inventors have devised a solution that can reduce capacitance, improve etch selectivity and lower electric field enhancement. The solution includes selectively growing a dielectric cap on the surface of the ILD separating the metal lines, followed by selectively growing a metal oxide liner on the dielectric cap (including on sidewalls of the dielectric cap). In exemplary embodiments, the structure including the dielectric cap and the metal oxide liner has a combined vertical thickness of least 4 nm but less than 6 nm.

In accordance with an embodiment of the present disclosure, the dielectric cap is confined within the ILD, and extends to an interface between the ILD and the metal lines, or extends over a portion of the metal lines. In embodiments, the metal oxide liner is aligned with an interface between the metal lines and the ILD, or extends over a portion of the metal lines to prevent the ILD from being etched during a via opening process. In embodiments, an etch stop layer is formed on the metal oxide liner for facilitating via opening process.

Figure 1B:
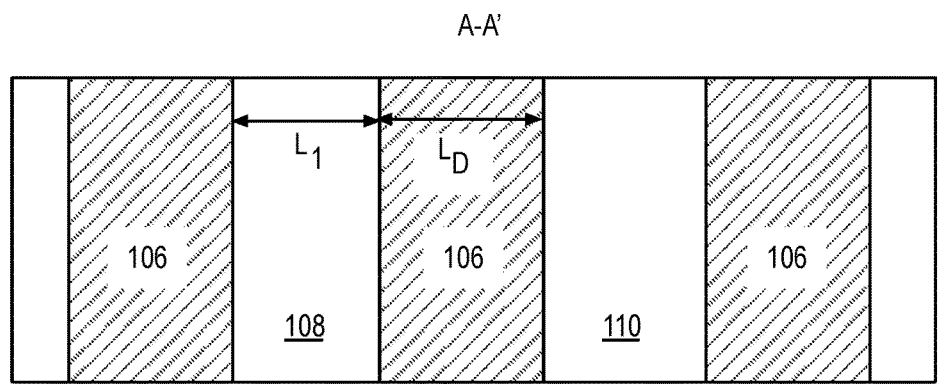
FIG. 1B is a plan-view illustration of an embodiment of the structure in FIG. 1A.

FIG. 1A is a cross-sectional illustration of an integrated circuit structure 100 that includes an interconnect level 102 above a substrate 104. Substrate 104 may be a semiconductor substrate. In a particular embodiment, the substrate 201 includes monocrystalline silicon. Interconnect level 102 includes an ILD 106 between a pair of interconnect structures, such as interconnect structure 108 and interconnect structure 110. Uppermost surfaces 108A and 110A of interconnect structure 108 and interconnect structure 110, respectively, are substantially coplanar with uppermost surface 106A of the ILD 106, as shown. In exemplary embodiments, interconnect structures 108 and 110 are lines, as shown in the plan-view illustration of FIG. 1B. In embodiments, interconnect structure 108 and interconnect structure 110 each have a lateral width, $L_1$. The interconnect structure 108 and interconnect structure 110 are spaced apart by a distance $L_D$, which is also equal to a lateral width of the ILD 106. In exemplary embodiments, $L_1$ and $L_D$ have a 1:1 ratio, where $L_1$ and $L_D$ are each between 15 nm and 20 nm. In other embodiments, $L_1$ and $L_D$ are unequal. In other embodiments, interconnect structures 108 and 110 are vias (not shown). Referring again to FIG. 1A, interconnect structure 108 and interconnect structure 110 each include a metal such as Co, Cu, Ru, Mo or W, or an alloy thereof.

The integrated circuit structure 100 further includes an interconnect level 112 above interconnect level 102. The interconnect level 112 includes a cap structure 114 on ILD 106. Cap structure 114 includes a top surface 114A and sidewall surfaces 114B. A liner 116 is on the top surface 114A and on sidewall surfaces 114B of the cap structure 114. Collectively cap structure 114 and liner 116 are designed to mitigates adverse effects such as increased capacitance, electrical shorting between interconnects, and enhanced electric field effects.

In embodiments, cap structure 114 includes a dielectric material that is substantially similar to a dielectric material of the ILD 106. For example, ILD 106 may include silicon and oxygen. In some embodiments, ILD 106 further includes trace amounts of carbon in addition to silicon and oxygen. In some such embodiments, the trace amounts of carbon is approximately 1 atomic percent or less. In other embodiments, ILD 106 includes silicon and one or more of oxygen, nitrogen or carbon. Cap structure 114 may include a material chosen for a low dielectric constant, for example less than 2, to minimize capacitance. In some embodiments, cap structure 114 includes silicon and oxygen. In other embodiments, cap structure 114 also includes trace amounts of aluminum in addition to silicon and oxygen, such as for example, approximately 1 atomic percent or less of aluminum. The liner 116 includes a material chosen to provide etch selectivity during fabrication of integrated circuit structure 100. As such, in an embodiment, liner 116 includes oxygen and aluminum, (e.g., $Al_2O_3$). In embodiments, an $Al_2O_3$ liner 116 has a dielectric constant that is greater than the dielectric constant of cap structure 114. In other embodiments, the liner 116 includes oxygen and one or more of Al, Ti, Hf or Zr.

Collectively cap structure 114 and liner 116 are chosen to include materials and have a shape that mitigates adverse effects of capacitance, electrical shorting between interconnects, and enhanced electric field effects. As such, cap structure 114 and liner 116 may have some of the structural embodiments depicted in FIGS. 2A-2C.

Figure 2A:
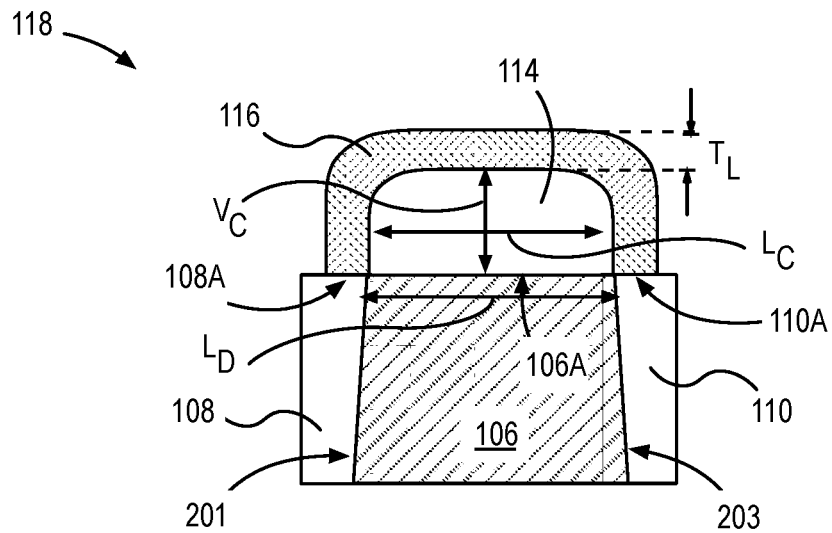
FIG. 2A is an enhanced cross sectional illustration of a portion of the integrated circuit structure, where a cap structure is as wide as an interlayer dielectric separating a pair of interconnect structures, in accordance with an embodiment of the present disclosure.

FIG. 2A is an enhanced cross sectional illustration of a portion inside dashed box 118 of the integrated circuit structure 100 illustrated in FIG. 1A, in accordance with an embodiment of the present disclosure. As shown, cap structure 114 extends to an interface 201 between ILD 106 and the interconnect structure 108 and interface 203 between ILD 106 and interconnect structure 110. In the illustrative embodiment, the cap structure 114 has a lateral thickness, $L_C$, that is substantially the same as the lateral thickness, $L_D$, of the ILD 106. The cap structure 114 has a vertical thickness, $V_C$, (along the z-axis) as measured from uppermost surface 106A. In embodiments, $V_C$, is between 3 nm and 6 nm. As shown, edges, or an apex where the top surface 114A meets sidewall 114B of cap structure 114, are rounded. Rounded features are indicative of a process operation utilized to form cap structure 114 and will be discussed further below. When cap structure 114 extends to interface 201 and 203, the liner 116 extends over interconnect structures 108 and 110. In the illustrative embodiment, liner 116 is in contact with uppermost surfaces 108A and 110A. The liner 116 has a thickness $T_L$. In embodiments, $T_L$ is between 0.7 nm and 2 nm. A combined vertical thickness of the liner 116 and cap structure 114 is chosen to provide mitigation against etch damage and provide appreciably low capacitance.

Figure 2B:
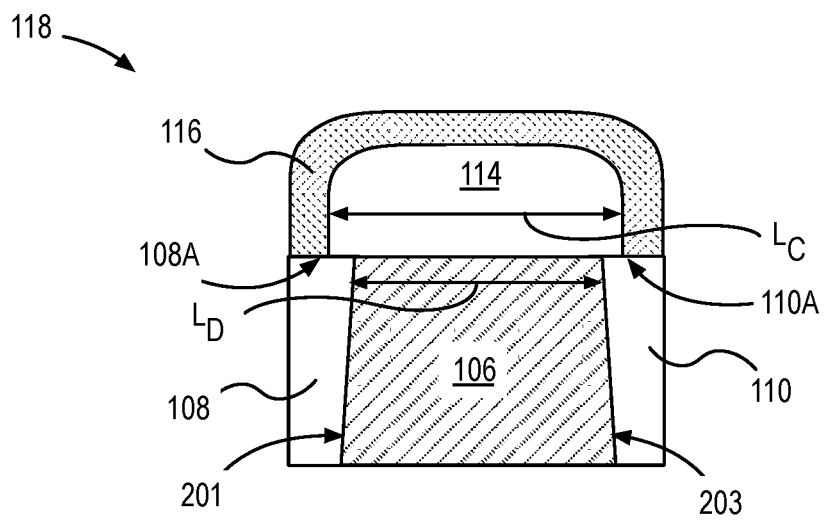
FIG. 2B is an enhanced cross sectional illustration of a portion of the integrated circuit structure, where a cap structure is wider than an interlayer dielectric separating a pair of interconnect structures, in accordance with an embodiment of the present disclosure.

FIG. 2B is an enhanced cross sectional illustration of a portion inside dashed box 118 of the integrated circuit structure 100 illustrated in FIG. 1A, in accordance with an embodiment of the present disclosure. As shown, cap structure 114 extends beyond interface 201 and interface 203. In the illustrative embodiment, cap structure 114 is in contact with portions of uppermost surfaces 108A and 110A. In some such embodiments, cap structure 114 has a lateral thickness, $L_C$, that is greater than $L_D$. The liner 116 also extends over interconnect structures 108 and 110. In the illustrative embodiment, liner 116 is in contact with portions of the uppermost surface 108A and 110A.

Figure 2C:
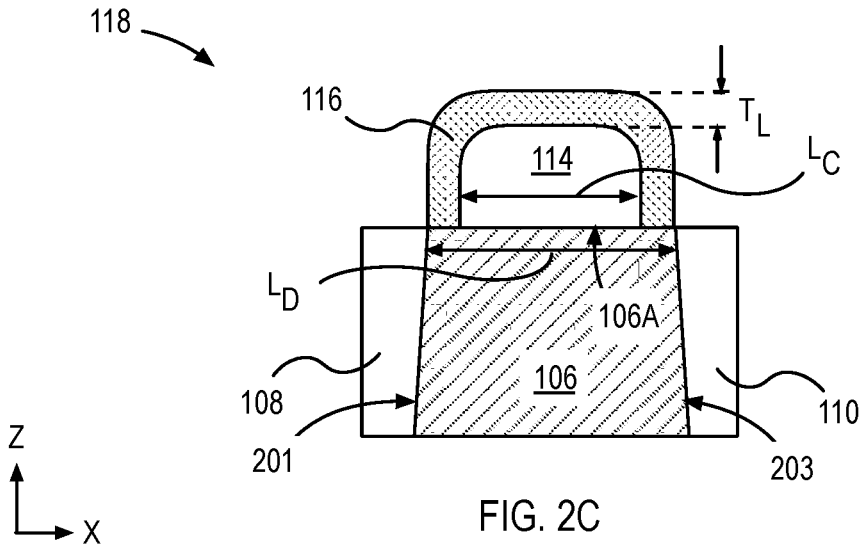
FIG. 2C is an enhanced cross sectional illustration of a portion of the integrated circuit structure where an interlayer dielectric (ILD) separating a pair of interconnect structures is wider than a cap structure, in accordance with an embodiment of the present disclosure.

FIG. 2C is an enhanced cross sectional illustration of a portion inside dashed box 118 of the integrated circuit structure 100 illustrated in FIG. 1A, in accordance with an embodiment of the present disclosure. As shown, cap structure 114 does not extend to interfaces 201 or 203. In the illustrative embodiment, $L_C$ is less than $L_D$. In the illustrative embodiment, portions of the liner 116 that is adjacent to sidewalls 114B, extends to interfaces 201 and 203. As shown, uppermost surface 106A of the ILD 106 has a lateral thickness, $L_D$, that is equal to a combined sum of the lateral thickness, $L_C$, of cap structure 114 and two times a thickness, $T_L$, of the liner 116. In the illustrative embodiment, the liner 116 protects edges of ILD 106 at interfaces 201 and 203 during processing.

Figure 3A:
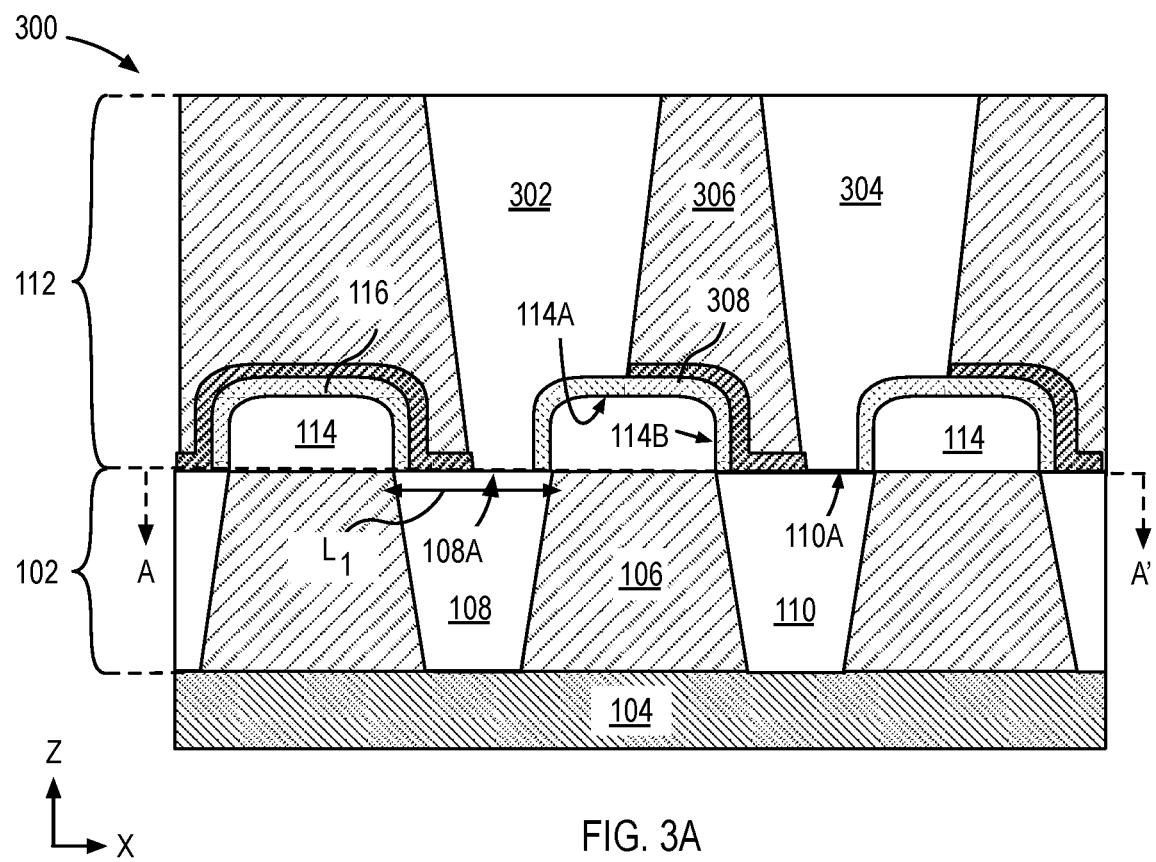
FIG. 3A is a cross-sectional illustration of an integrated circuit structure where a via is misaligned from an interconnect structure.

FIG. 3A is a cross-sectional illustration of an integrated circuit structure 300. In the illustrative embodiment, integrated circuit structure 300 includes one or more features of the integrated circuit structure 100, such as interconnect structures 108 and 110, dielectric 106, cap structure 114 and liner 116. In the illustrative embodiment, cap structure 114 has one or more features of cap structure 114 that are described in association with FIG. 2A.

Referring again to FIG. 3A, interconnect level 112 further includes interconnect structures 302 and 304 separated by an ILD 306. In embodiments, ILD 306 includes silicon and one or more of oxygen, nitrogen or carbon. In some embodiments, ILD 306 includes a material that is the same or substantially the same as the material of the ILD 106. In examples, such as is shown, interconnect structures 302 and 304 are misaligned with interconnect structures 108 and 110, respectively. In the illustrative embodiment, interconnect structures 302 and 304 are on least a portion of the interconnect structures 108 and 110, respectively. As shown, lowermost portions of interconnect structures 302 and 304 are each in contact with approximately half of the lateral thickness, $L_1$, of uppermost surfaces 108A and 110A, respectively. Furthermore, portions of interconnect structures 302 and 304 are also adjacent to a portion of liner 116 due to the misalignment.

It is to be appreciated that presence of liner 116 on uppermost surfaces 108A and 110A reduces an effective contact surface area for the interconnect structures 302 and 304. However, a lateral thickness, of liner 116, of less than 2 nm does not appreciably reduce an effective contact area between interconnect structure 108 and interconnect structure 302, and between interconnect structure 110 and interconnect structure 304. The lateral thickness of liner 116, can be further reduced by either densifying liner 116 post etch and exposure of interconnect structures 108 and 110.

The interconnect structures 302 and 304 each extend over a portion of individual cap structures 114, as shown. In the illustrative embodiment, the interconnect structures 302 and 304 are not in contact with respective cap structure 114 or with ILD 106.

In an embodiment, interconnect level 112 further includes an etch stop layer 308 between liner 116 and ILD 306. For example, etch stop layer 308 is on a portion of the liner 116 that is on top surface 114A. In the illustrative embodiment, etch stop layer 308 is also adjacent to liner 116 that is adjacent to sidewall 114B. Also as shown, etch stop layer 308 continuously extends between interconnect structure 302 and interconnect structure 304. In the illustrative embodiment, due to the misalignment, etch stop layer 308 is also on a portion of uppermost surfaces 108A and 110A. As such, etch stop layer 308 is between portions of interconnect structures 108 and 110 and ILD 306. It is to be appreciated that the etch stop layer 308 is not between the liner 116 and interconnect structure 302 nor between liner 116 and interconnect structure 304. In embodiments, the etch stop layer 308 includes silicon, nitrogen and one or more of oxygen or carbon. In exemplary embodiments, etch stop layer 308 includes a material that is different from a material of the ILD 306 or ILD 106 to provide etch selectivity. In some such embodiments, the etch stop layer 308 includes silicon and nitrogen and is doped with less than 15 atomic percent of carbon to provide etch selectivity against the material of the ILD 306.

The cap structure 114 and liner 116 provide lateral and vertical separation between interconnect structure 302 and interconnect structure 110. Such lateral and vertical separations reduces an effective capacitance that can develop between interconnect structure 110 and interconnect structure 302, during operation. In embodiments, interconnect structure 302 and 304 each include a metal such as Co, Cu, Ru, Mo or W, or an alloy thereof.

Figure 3B:
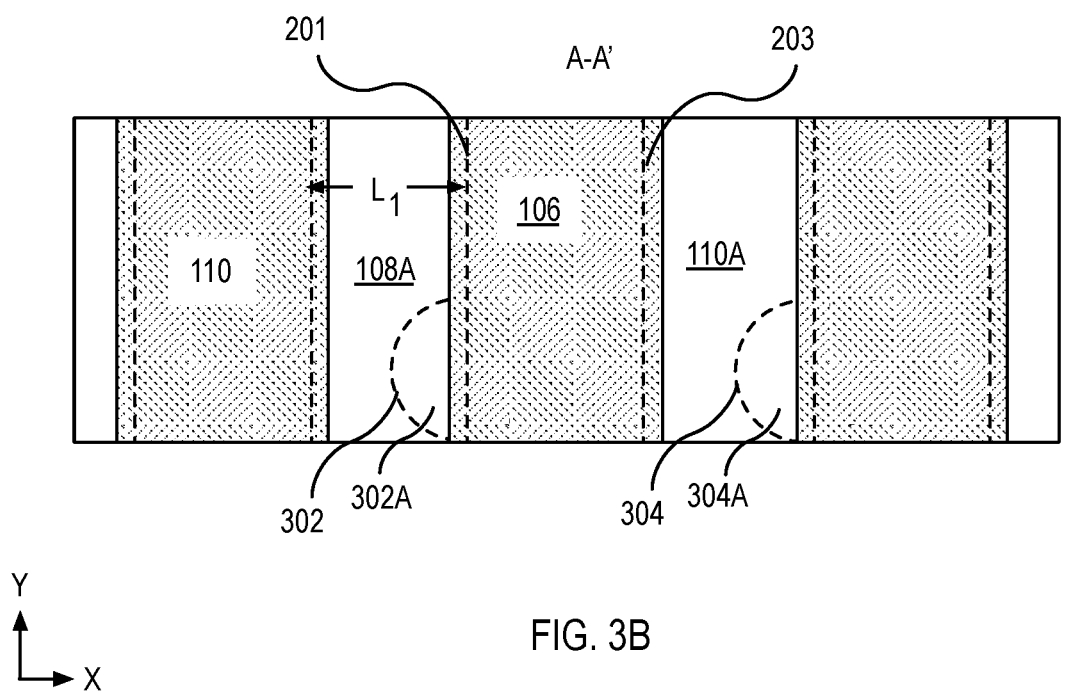
FIG. 3B is a plan view illustration of the structure in FIG. 3A though a horizontal line A-A'.

FIG. 3B is a plan view illustration, though a horizontal line A-A', of the structure in FIG. 3A. In an embodiment, an outline of lowermost surfaces 302A and 304A of interconnect structures 302 and 304 are shown within dashed lines. Lowermost surfaces 302A and 304A interface with uppermost surface 108A and 110A, respectively. In the illustrative embodiment, the interconnect structures 302 and 304 are vias and have a circular plan view shape. Lower most surfaces 302A and 304A are partial circles. As shown, lower most surfaces 302A and 304A are each in contact with approximately half of the lateral thickness, $L_1$, of uppermost surfaces 108A and 110A, respectively. In other embodiments, an overlap between lower most surfaces 302A and 304A and uppermost surfaces 108A and 110A vary depending on an extent of misalignment.

Figure 4:
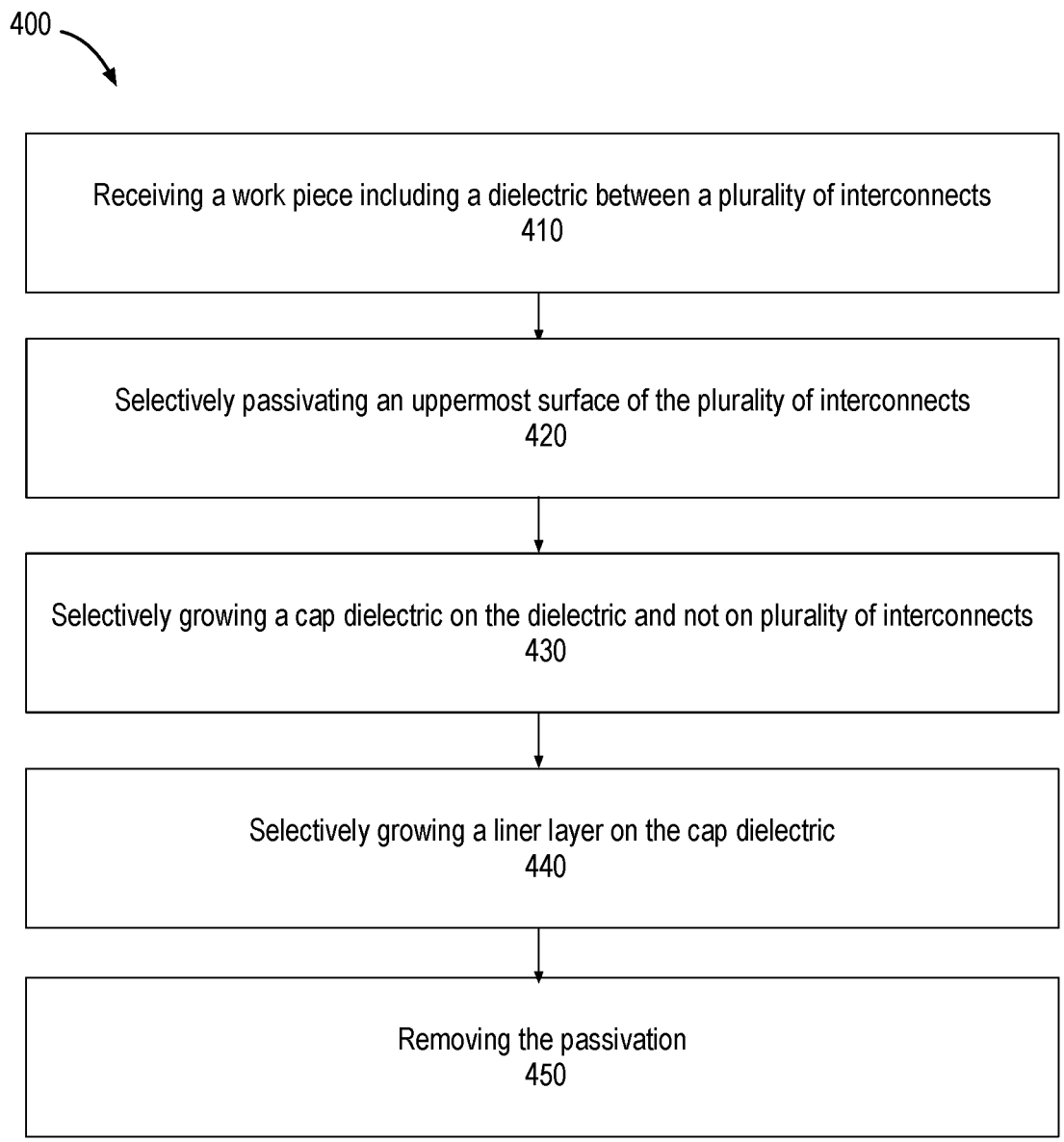
FIG. 4 is a flow diagram for a method to fabricate an integrated circuit structure, including a cap structure and a liner between two interconnect levels, in accordance with an embodiment of the present disclosure.

FIG. 4 is a flow diagram for a method to fabricate an integrated circuit structure, including a cap structure and a liner between two interconnect levels, in accordance with an embodiment of the present disclosure. The method 400 begins at operation 410 by receiving a work piece including a dielectric between a plurality of interconnects on a first level. The method 400 continues at operation 420 by selectively passivating an uppermost surface of the plurality of interconnects relative to uppermost surface of the dielectric. The method 400 continues at operation 430 by selectively growing a cap dielectric on the dielectric and not on the plurality of interconnects. The method 400 continues at operation 440 by selectively growing a liner on the cap dielectric. The method 400 concludes at operation 450 by removing the passivation from the plurality of interconnects and forming a second level of interconnect structures.

Figure 5A:
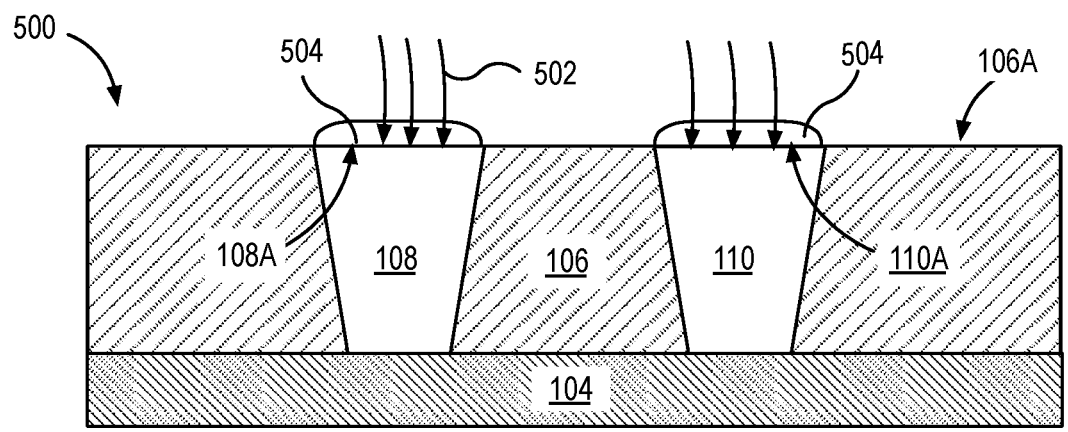
FIG. 5A is a cross-sectional illustration of a passivation layer formed on interconnect structures that are between an interlayer dielectric (ILD), in accordance with an embodiment of the present disclosure.

FIG. 5A is a cross-sectional illustration of a workpiece 500 that includes interconnect structures 108 and 110 formed between ILD 106, in accordance with an embodiment of the present disclosure. In the illustrative embodiment, interconnect structures 108 and 110 and ILD 106 are formed above a substrate 104. Substrate 104 may be a semiconductor substrate. In a particular embodiment, the substrate 201 includes monocrystalline silicon. In other embodiments, the substrate 104 includes silicon germanium, germanium, or a silicon on insulator (SOI) or group III-V materials.

In an embodiment, the fabrication process begins by passivating (indicated by arrows 502) uppermost surfaces 108A and 110A of the interconnect structure 108 and interconnect structure 110 with a metal (or metal oxide) passivation layer 504. The passivation process utilizes formation of a selective chemical bond between the passivation layer 504 and the material of the interconnect structures 108 and 110 and not between passivation layer 504 and the material of the ILD 106.

In an embodiment, the passivation layer 504 includes self-assembled monolayers of thiols, silanes and phosphonates that are formed on uppermost surfaces 108A and 110A by a process of molecular layer deposition. In an embodiment, the molecular layer deposition results in a carbon rich surface on the metal of interconnect structures 108 and 110, such as for example, copper, tungsten etc. The carbon rich surface may act as a hydrophobic barrier to ALD precursors and co-reactants which will be introduced during formation of dielectric and liner materials. In an embodiment, the passivation layer 504, formed, is self-limiting and grows to a thickness of less than 2 nm.

In the illustrative embodiment, the interconnect structure 108 includes a single conductive material adjacent to ILD 106. In some such embodiments, the interconnect structure 108 includes a conductive material, such as but not limited to, titanium nitride or tantalum nitride. In some such embodiments, the passivation layer 504 is formed over an entire surface 108A as is shown. As shown, the passivation layer 504 is not formed on the ILD 106.

Figure 5B:
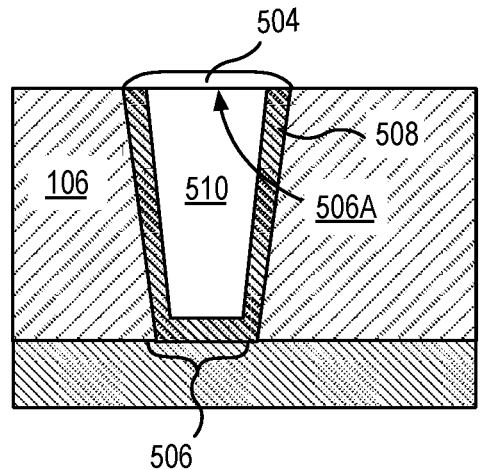
FIG. 5B is a cross-sectional illustration of a passivation layer formed on an interconnect structure that includes a metallic liner and a fill metal adjacent to the metallic liner, in accordance with an embodiment of the present disclosure.

In exemplary embodiments, the interconnect structures 108 and 110 include two or more materials, where a first material is a metallic liner, and a second material is a fill metal. FIG. 5B is a cross-sectional illustration of an interconnect structure 506 that includes a metallic liner 508 adjacent to the ILD 106 and a fill metal 510 adjacent to the metallic liner 508, in accordance with an embodiment of the present disclosure. In embodiments, the metallic liner 508 includes titanium, tantalum ruthenium, nitrides of tantalum (for e.g., tantalum nitride) or nitrides of titanium (for e.g., titanium nitride). In some embodiments, fill metal 510 includes copper, cobalt, ruthenium, tungsten, molybdenum, or nickel, or an alloy thereof.

Figure 5C:
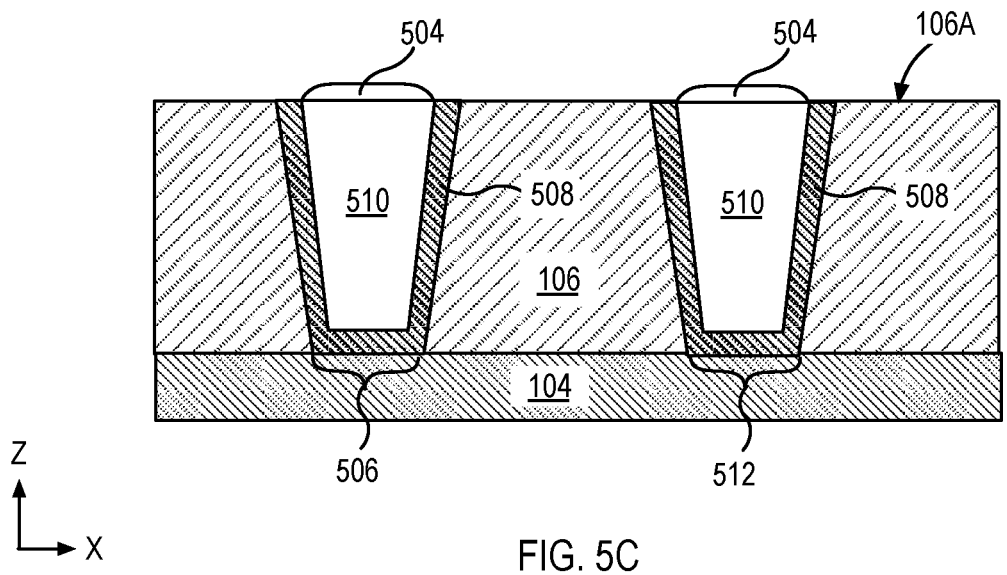
FIG. 5C is a cross-sectional illustration of a passivation layer formed on a fill metal but not on the metallic liner of interconnect structures, in accordance with an embodiment of the present disclosure.

The passivation layer 504 may be formed on uppermost surface 506A of the interconnect structure 506. In the illustrative embodiment, the passivation layer 504 is formed on the metallic liner 508 as well as on the fill metal 510. In other embodiments, the passivation layer 504 is formed on the fill metal 510 but not on the metallic liner 508, such as is shown in FIG. 5C. In some such embodiments, the passivation chemistry is chemically selective to the metal, but not to the metallic liner 508 and leaves the metallic liner 508 unpassivated.

Figure 6A:
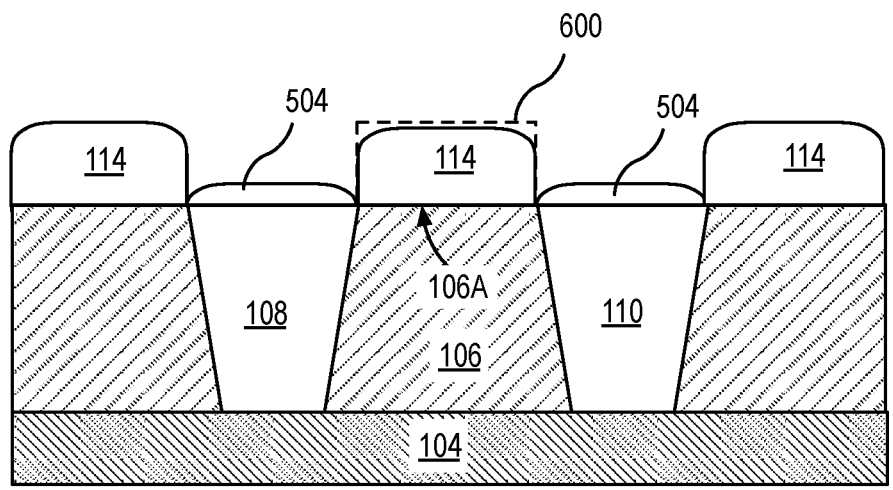
FIG. 6A is a cross-sectional illustration of the structure in FIG. 5A following the formation of cap structures on uppermost surfaces of the ILD.

FIG. 6A is a cross-sectional illustration of the structure in FIG. 5A following the formation of a cap structure 114. In an embodiment, the cap structure 114 is formed by an atomic layer deposition (ALD) process, selectively on the surface 106A of ILD 106. In an embodiment, precursors for formation of the cap structure 114 do not adhere to the passivation layer 504, but adhere to the material of ILD 106. In an embodiment, the cap structure 114 includes silicon and oxygen.

As shown, in an exemplary example, the cap structure 114 is formed on the ILD surface 106A directly adjacent to the passivation layer 504. In some embodiments, ILD deposition process may form a cap structure 114 with rounded edges at top surface 114A. In other embodiments, the corners are not rounded as indicated by dashed lines 600. In some embodiments, the passivation layer 504 is removed after formation of cap structure 114. In other embodiments, passivation layer 504 is not removed until a liner is formed on the cap structure 114.

Figure 6B:
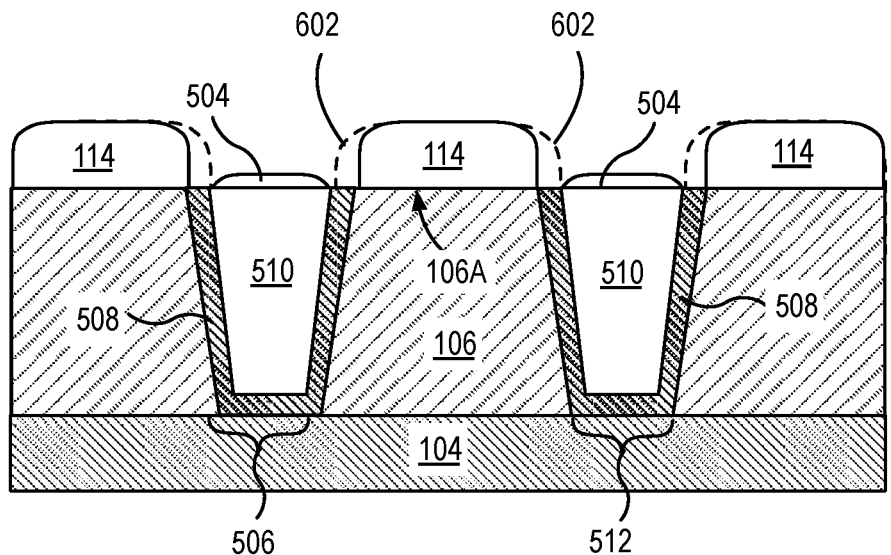
FIG. 6B is a cross-sectional illustration of the structure in FIG. 5C following the formation of cap structures on uppermost surfaces of the ILD.

FIG. 6B is a cross-sectional illustration of the structure in FIG. 5C following the formation of a cap structure 114 on the ILD 106. In an embodiment, the cap structure 114 is formed by a process described in association with FIG. 6A. In the illustrative embodiment, the cap structure 114 is formed on the surface 106A of the ILD 106, but not on the metallic liner 508 of interconnect structures 506 and 512. In other embodiments, the cap structure 114 is also formed on the metallic liner 508, as indicated by dashed lines 602.

Figure 7A:
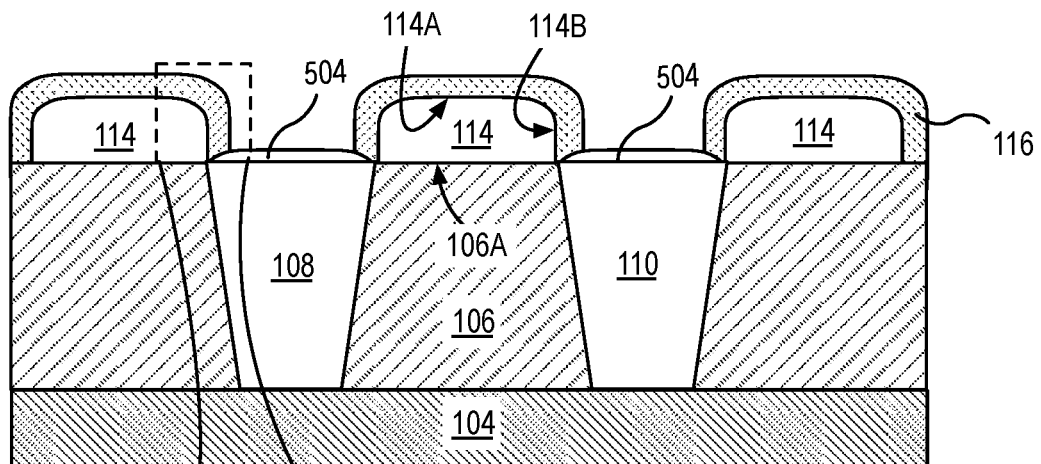
FIG. 7A is a cross-sectional illustration of the structure in FIG. 6A following the formation of a liner on top surface and on sidewalls of the cap structure.

FIG. 7A is a cross-sectional illustration of the structure in FIG. 6A following the formation of a liner 116 on top surface 114A and on sidewalls 114B of the cap structure 114. The liner 116 may be formed immediately after formation of the cap structure 114 in a same process chamber without breaking vacuum.

In an embodiment, the liner 116 is deposited by an ALD process. The ALD process forms the liner 116 on the cap structure 114 but not on the passivation layer 504. In embodiments, the carbon rich surface of the passivation layer 504 act as a hydrophobic barrier to ALD precursors and co-reactants introduced during formation of the liner 116. In an embodiment, the liner 116 includes oxygen and one or more of Al, Ti, Hf or Zr. The liner 116 may be deposited to a thickness between 0.7 nm and 2 nm. In some embodiments, the as deposited thickness of the liner 116 may depend on the choice of material to lower an effective capacitance.

Figure 7B:
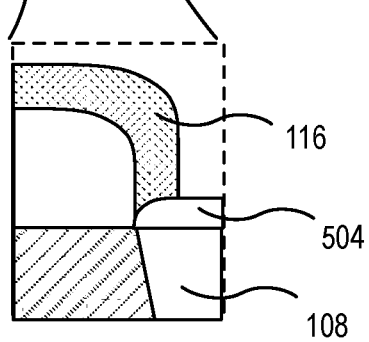
FIG. 7B is an enhanced cross-sectional illustration of a portion of the structure in FIG. 7A.

In the illustrative embodiment, the liner 116 is over but not in contact with the metallic liner 508, as illustrated in the enhanced cross-sectional illustration of FIG. 7B. In some such embodiments, the liner 116, as shown, is over a portion of interconnect structure 108. Liner 116 has a same or substantially the same features over other portions of interconnect structure 108 or over interconnect structure 110 (not shown).

In some embodiments, the passivation layer 504 is removed after formation of cap structure 114. In some such embodiments, a new passivation layer is formed on the interconnect structures 108 and 110 prior to formation of liner 116.

Figure 8:
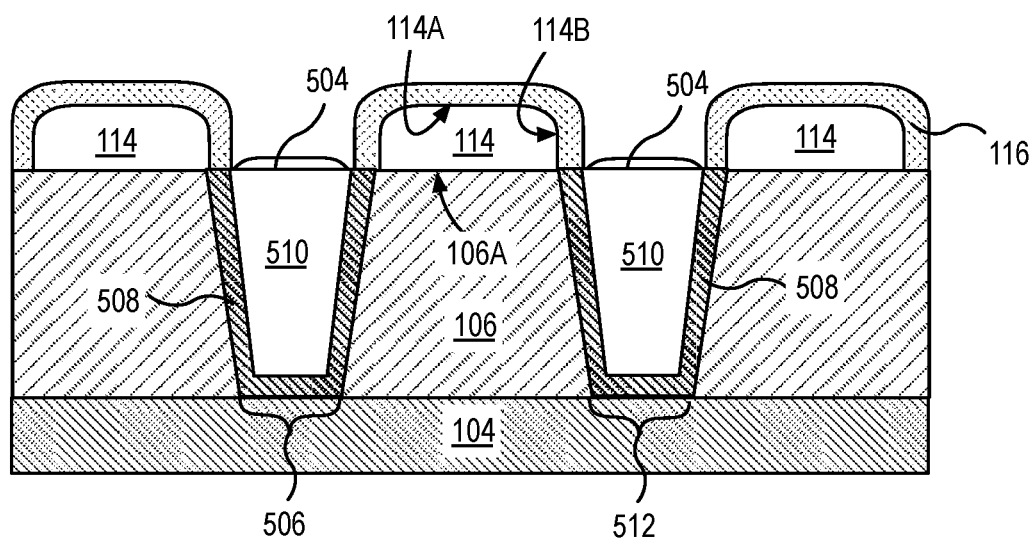
FIG. 8 is a cross-sectional illustration of the structure in FIG. 6B following the formation of a liner on a top surface and on sidewalls of each of the cap structures.
Figure 8:
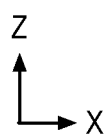

FIG. 8 is a cross-sectional illustration of the structure in FIG. 6B following the formation of liner 116. In an embodiment, the process to form liner 116 is the same or substantially the same as the process described in association with FIG. 7A. In an exemplary embodiment, the liner 116 is formed on the cap structure 114, including on the top surface 114A and on sidewall 114B. As shown in the illustration, while forming the liner 116 on the sidewall 114B, the ALD process also form liner 116 on the metallic liner 508.

FIGS. 9A-9D represent cross-sectional illustrations depicting a series of operations to form interconnect structures above interconnect structures 108 and 110.

Figure 9A:
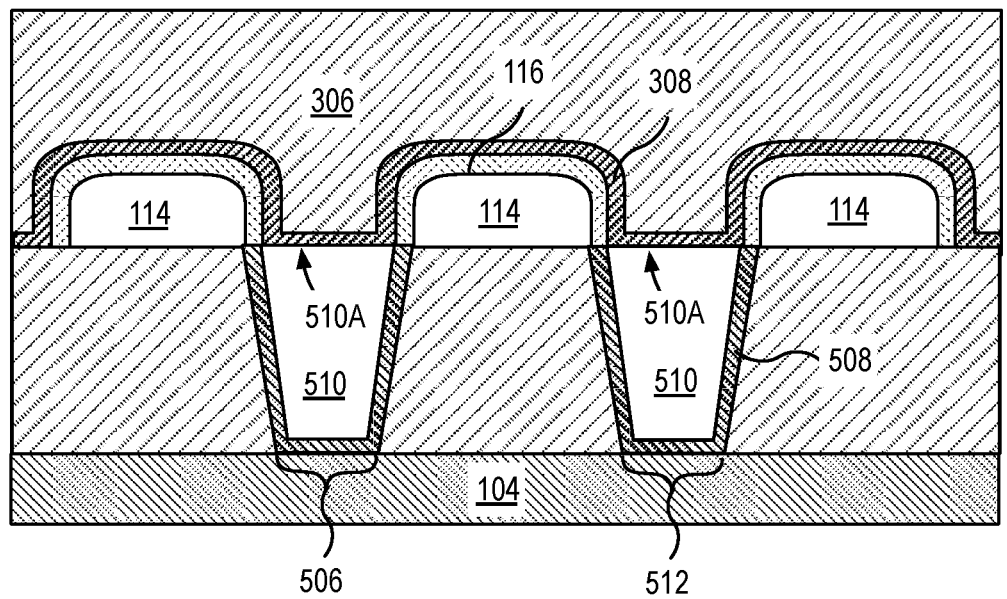
FIG. 9A is a cross-sectional illustration of the structure in FIG. 8 following the formation of an etch stop layer on the liner and on uppermost surfaces of the interconnect structures and following the formation of an ILD on the etch stop layer.

FIG. 9A is a cross-sectional illustration of the structure in FIG. 8 following the formation of an etch stop layer 308 and ILD 306 on the etch stop layer 308.

Prior to deposition of the etch stop layer 308, the passivation layer 504 is removed from the surface 510A of the fill metal 510. The passivation layer 504 may be removed by a plasma etch process or a wet chemical process selective to the liner 116 and the fill metal 510. In the illustrative embodiment, the etch stop layer 308 is deposited on the liner 116 and on uppermost surfaces 510A of the fill metal 510 of each interconnect structure 506 and 512. As shown, the etch stop layer 308 is not formed on the metallic liner 508. The etch stop layer 308, may be substantially conformal with the liner 116. An ALD process, for example, may be utilized to conformally deposit a 3 nm-5 nm thick etch stop layer 308. In the illustrative embodiment, the etch stop layer 308 includes silicon, nitrogen and one or more of oxygen or carbon. In some embodiments, the etch stop layer 308 includes silicon and nitrogen and is doped with less than 15 atomic percent of carbon.

ILD 306 may be blanket deposited on the etch stop layer 308. In embodiments, the ILD 306 may be self-planarizing during the deposition process or is planarized by a chemical mechanical polish process after deposition. In an embodiment, the ILD 306 is deposited by a chemical vapor deposition process (CVD), physical vapor deposition (PVD) process or a plasma enhanced chemical vapor deposition (PECVD) process.

Figure 9B:
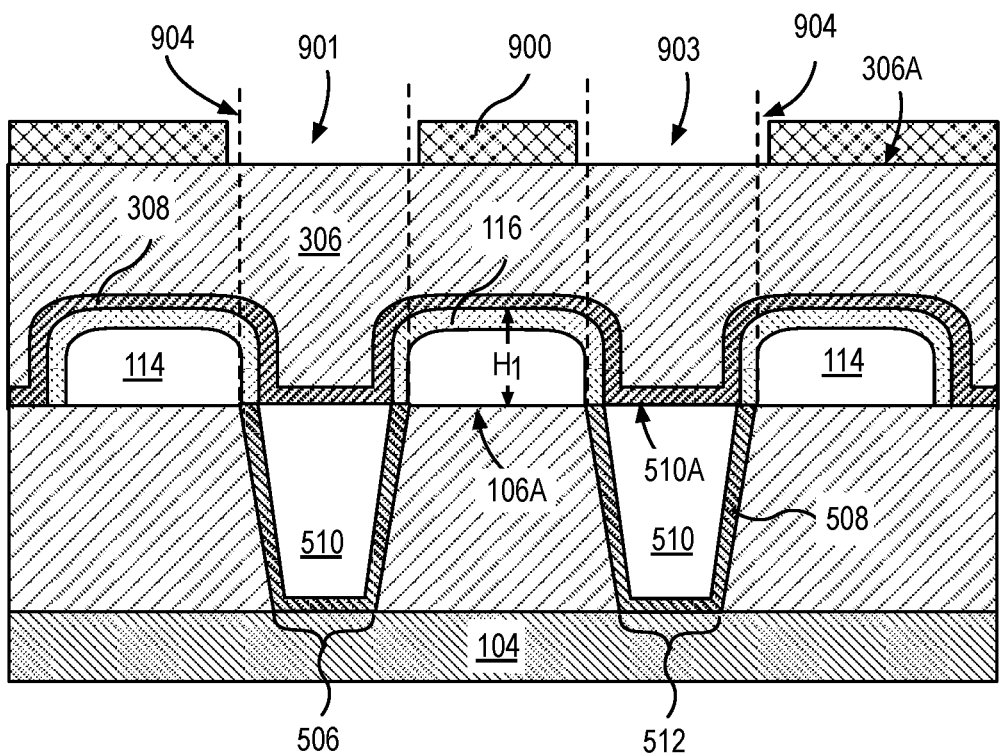
FIG. 9B is a cross-sectional illustration of the structure in FIG. 9A following the formation of a mask on an uppermost surface of the ILD.

FIG. 9B is a cross-sectional illustration of the structure in FIG. 9A following the formation of a mask 900 on an uppermost surface 306A of the ILD 306. In an embodiment, the mask 900 is formed by a lithographic process and includes a photoresist material. The mask 900 includes openings 901 and 903 to expose portions of the ILD 306 to be etched. In some embodiments, the mask is designed to form via openings or line openings. The openings 901 and 903 are designed to have a width that facilitates a minimum dimension of an opening, formed by an etch process, in the ILD 306 and in the etch stop layer 308. It is to be appreciated that the cap structure 114 and the liner 116 advantageously provide a step height, $H_1$, relative to the surface 510A or 106A to enhance alignment (indicated by dashed lines 904) between mask 900 and interconnect structures 506 and 512.

Figure 9C:
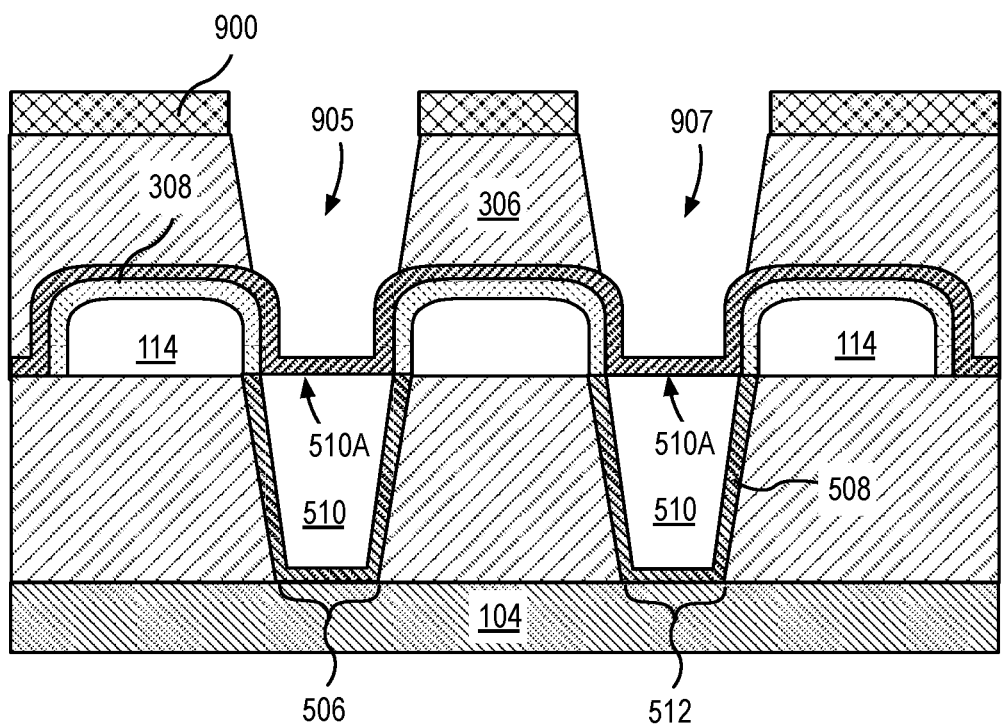
FIG. 9C is a cross-sectional illustration of the structure in FIG. 9B following the formation of plurality of openings in the ILD.

FIG. 9C is a cross-sectional illustration of the structure in FIG. 9B following the formation of openings 905 and 907 in the ILD 306. In an embodiment, a plasma etch process is utilized to etch ILD 306 and form openings 905 and 907. In the illustrative embodiment, the openings 905 and 907 each have tapered profiles. In the illustrative embodiment, the plasma etch process is halted after the etch stop layer 308 on surface 510A is exposed. As shown, portions of the etch stop layer 308 adjacent to the liner 116 are substantially unetched during etching of the ILD 306.

Figure 9D:
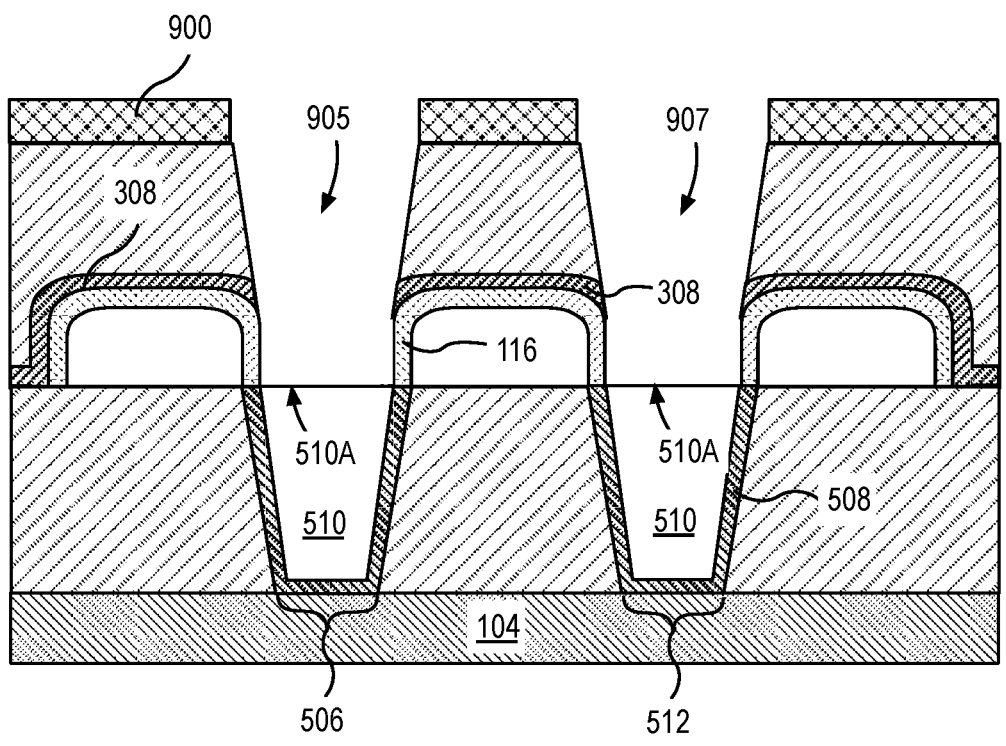
FIG. 9D is a cross-sectional illustration of the structure in FIG. 9C following the process to etch exposed portions of the etch stop layer within the plurality of openings.

FIG. 9D is a cross-sectional illustration of the structure in FIG. 9C following the process to etch exposed portions of the etch stop layer 308 within the openings 905 and 907. In an embodiment, a plasma etch process is utilized to etch and remove the etch stop layer 308 adjacent to the liner 116 and from surface 510A, to expose surface 510A, as shown. In exemplary embodiments, the liner 116 is not etched laterally during the plasma etch process. In some embodiments, the mask 900 may be removed prior to etching the etch stop layer 308 to avoid exposing surface 510A to an oxygen based chemistry for removal of photoresist material.

Figure 9E:
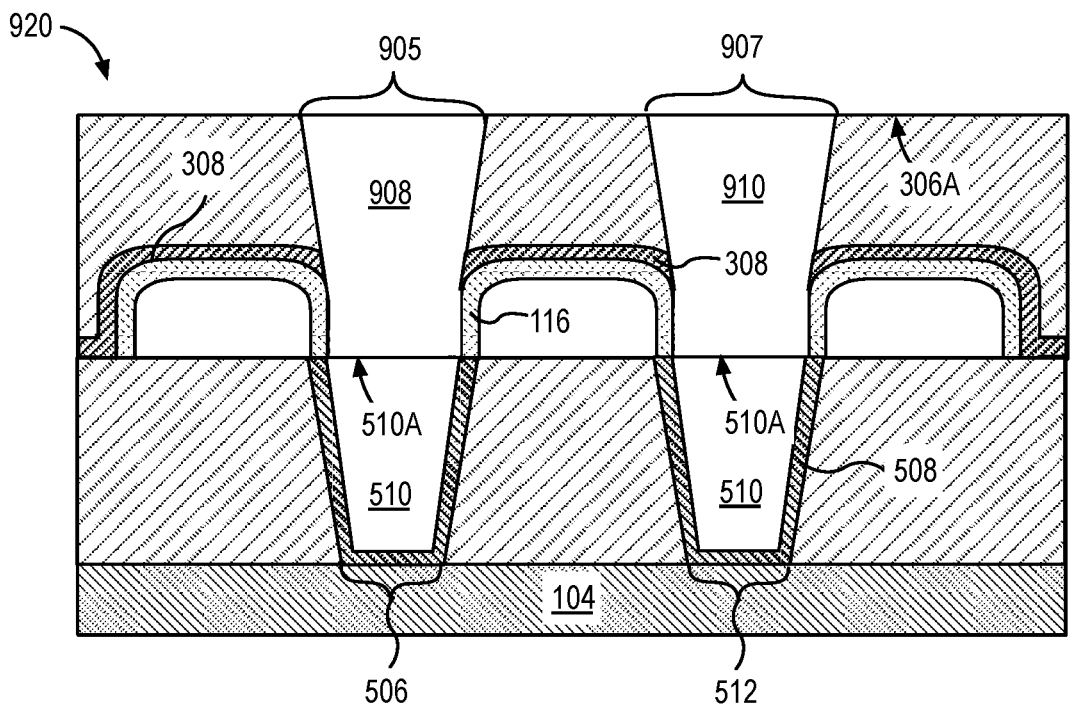
FIG. 9E is a cross-sectional illustration of the structure in FIG. 9D following the formation of an interconnect structure in each of the plurality of openings.

FIG. 9E is a cross-sectional illustration of the structure in FIG. 9D following the formation of interconnect structure 908 and interconnect structure 910 in the openings 905 and 907, respectively to form an integrated circuit structure 920. In some embodiments, mask 900 is removed after exposing the surface 510A. A conductive material to form interconnect structures 908 and 910 may be deposited into the openings 905 and 907, on the surface 510A, adjacent to liner 116, portions of etch stop layer 308, adjacent to ILD 306, and on uppermost surface 306A. In an embodiment, the conductive material includes electroplating copper after formation of a metallic liner (such as a metallic liner 508 described in association with FIG. 5B) in the openings 905 and 907. In other examples, one or more conductive materials, such as tungsten, cobalt or ruthenium are blanket deposited by a CVD or an ALD process after formation of a metallic liner (such as a metallic liner 508 described in association with FIG. 5B). After deposition, the conductive material may be removed from uppermost surface 306A by a CMP process to form interconnect structures 908 and 910.

Figure 10A:
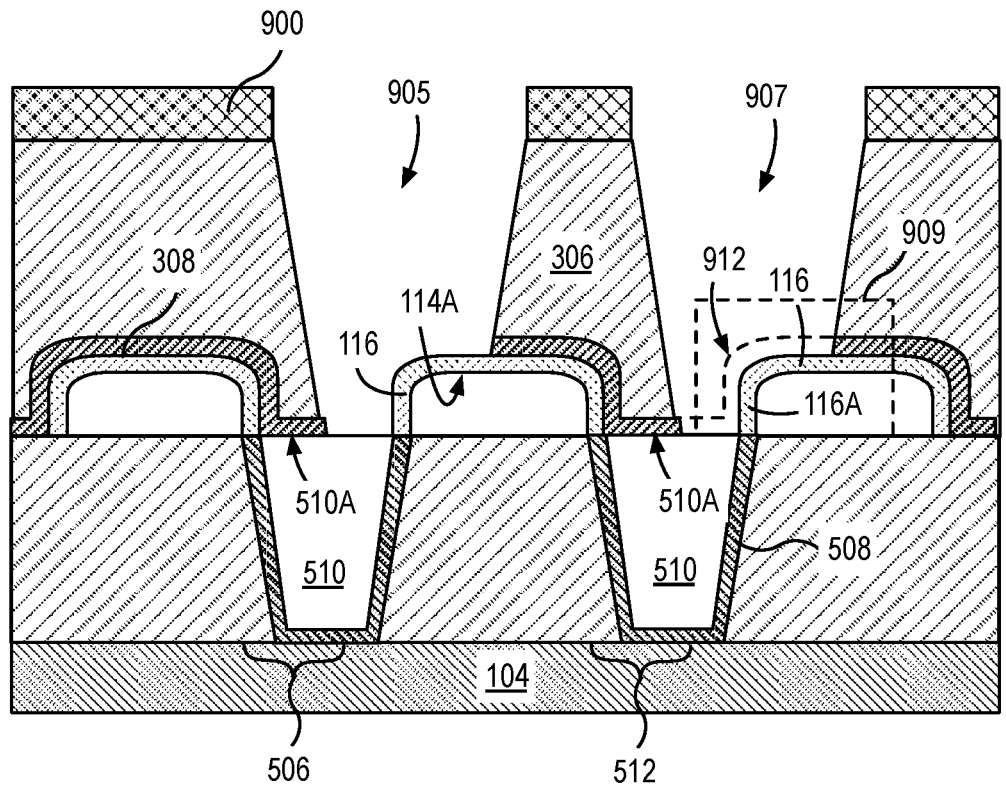
FIG. 10A is a cross-sectional illustration plurality of openings in an ILD, in accordance with an embodiment of the present disclosure.

In some embodiments there is misalignment between mask 900 and the interconnect structure 506 and 512. In some such embodiments, the openings 905 and 907 may expose portions of the liner 116 on top surface 114A of cap structure 114, as shown in FIG. 10A. As shown, the process of etching etch stop layer 308 exposes liner 116 on the top surface 114A of cap structure 114. In some embodiments, portion of etch stop layer 308 that is masked by ILD 306, remains on the uppermost surface 510A. As shown, the remaining portion of etch stop layer 116 extends from opening 905, under the ILD 306 to opening 907. In exemplary embodiments, the liner 116 is not etched during the process to form openings 905 and 907. As shown, liner 116 on top surface 114A is exposed immediately after etching portions of etch stop layer 308 (indicated by dashed lines 912). In some embodiments, during the process to over etch and remove etch stop layer 308 from portions adjacent to liner portion 116A, the liner 116 is unetched. In the illustrative embodiment, liner 116 has an adequate thickness and provides sufficient etch selectivity to remain intact during the process to completely etch openings 905 and 907, as shown.

Figure 10B:
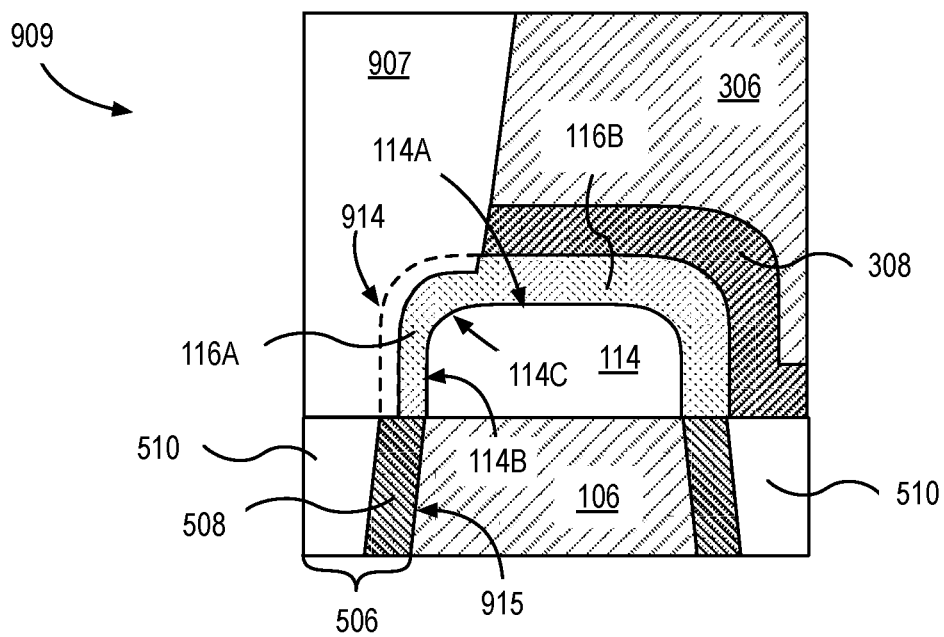
FIG. 10B is an enhanced cross sectional illustration of a portion of the opening in FIG. 10A.

In other embodiments portions of the liner 116 may be eroded after etching of etch stop layer 308. In some such embodiments, the liner 116 remain sufficiently intact, adjacent to the cap structure 114, as shown in FIG. 10B. FIG. 10B is an enhanced cross sectional illustration of a portion 909 of the structure in FIG. 10A, in embodiments where etching the etch stop layer 308 also etches portions of the liner 116. In the illustrative embodiment, a portion 116A of the liner 116 (within dashed lines 914) that is not covered by etch stop layer 308 may have a reduction in thickness compared to portion 116B of the liner 116 that are covered by etch stop layer 308. In some such embodiments, it is to be appreciated that liner 116 adequately protects interface 915 between interconnect structure 506 and ILD 106. In some embodiments, a rounded top edge portion 114C of the cap structure 114 can be exposed if portions of the liner 116A are etched. However in some such embodiments, liner portion 116A directly adjacent to sidewall surfaces 114B are not etched and ILD 106 is not exposed.

Figure 11:
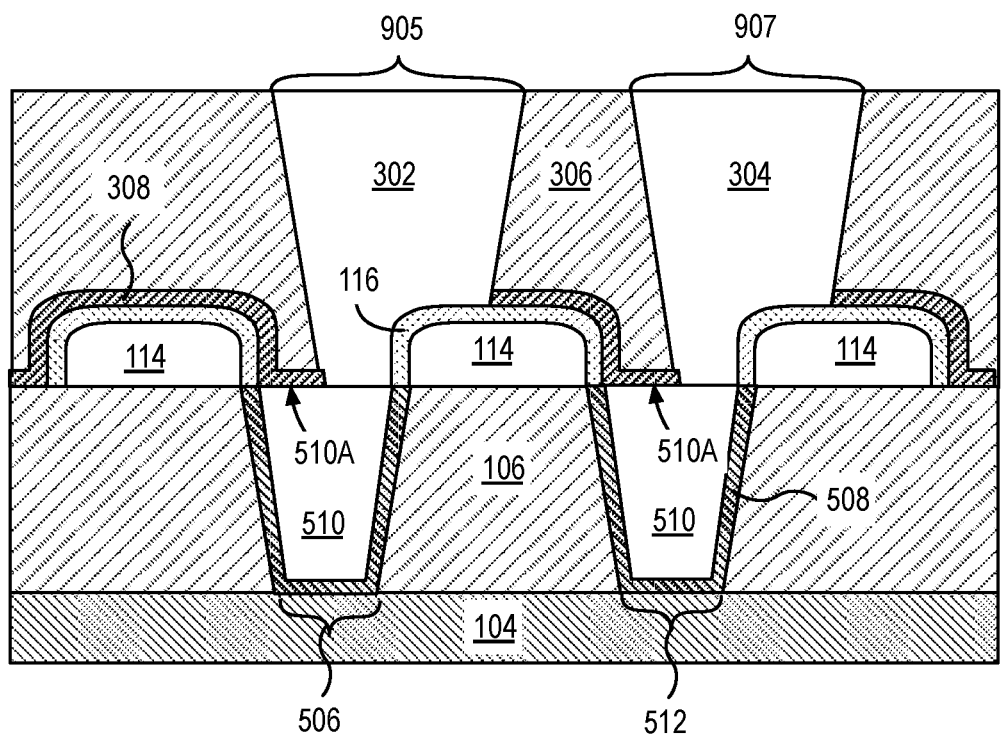
FIG. 11 is a cross-sectional illustration of the structure in FIG. 10A following the formation of an interconnect structure in each of a plurality of openings.

FIG. 11 is a cross-sectional illustration of the structure in FIG. 10A following the formation of interconnect structures 302 and 304 in the openings 905 and 907, respectively. In an embodiment, the process of forming interconnect structures 302 and 304 is substantially the same as the process described to form interconnect structures 908 and 910, in association with FIG. 9E. In the illustrative embodiment, interconnect structures 302 and 304 have one or more features as described in FIG. 3A, for example, interconnect structures 302 and 304 are adjacent to liner 116 and on at least a portion of interconnect structures 108 and 110, respectively.

Figure 12:
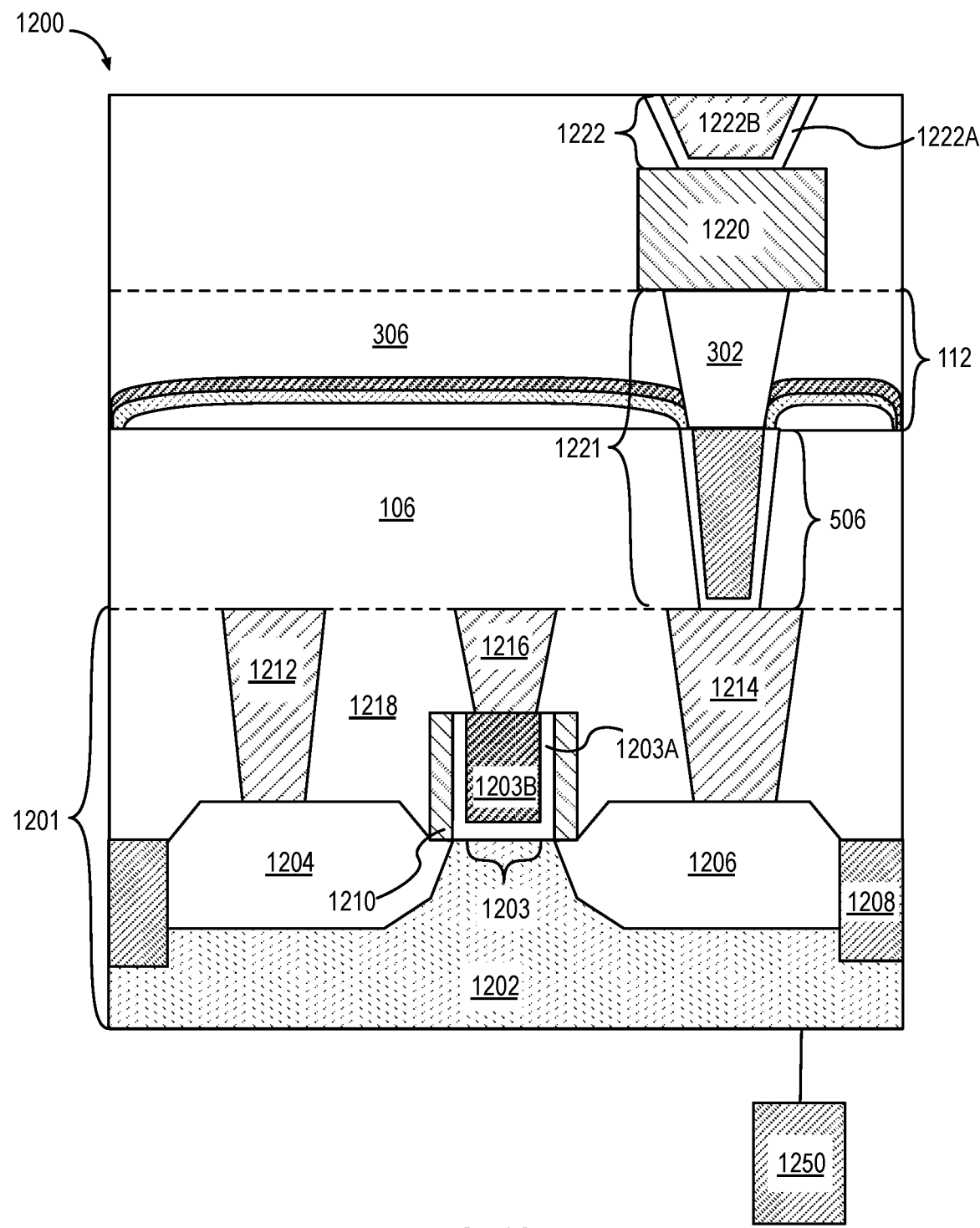
FIG. 12 is a cross-sectional illustration of a memory device coupled with a transistor through an integrated circuit structure.

FIG. 12 illustrates a system 1200 which includes access transistor 1201 coupled with a memory device through an integrated circuit structure, discussed herein. Referring again to FIG. 12 in an embodiment, the transistor 1201 is on a substrate 1202 and has a gate 1203, a source region 1204, and a drain region 1206. In the illustrative embodiment, an isolation 1208 is adjacent to the source region 1204, drain region 1206 and portions of the substrate 1202. In some implementations of the disclosure, such as is shown, a pair of sidewall spacers 1210 are on opposing sides of the gate 1203.

The transistor 1201 further includes a source contact 1212 above and electrically coupled to the source region 1204, drain contact 1214 above and electrically coupled to the drain region 1206 and a gate contact 1216 above and electrically coupled to the gate 1203, as is illustrated in FIG. 12. The transistor 1201 also includes dielectric 1218 adjacent to the gate 1203, source region 1204, drain region 1206, isolation 1208, sidewall spacers 1210, source contact 1212, drain contact 1214 and gate contact 1216.

In an embodiment, the system 1200 further includes a battery and antenna 1250 coupled to the transistor 1201.

In the illustrative embodiment, the integrated circuit structure 1221 includes one or more features of the integrated circuit structures 100 and 920 described above. Referring again to FIG. 12, an interconnect structure 506, within interconnect level 102, is coupled with the drain contact 1214. Interconnect level 102 may include other integrated circuit device structures (not shown). An interconnect structure 302 in an interconnect level 112 is coupled with interconnect structure 506. The interconnect level 112 includes a cap structure 114, liner 116 and an etch stop layer 308 on the liner 116. Lowermost portions of interconnect structure 302 is adjacent to liner 116. A memory device 1220 is coupled with interconnect structure 302. In the illustrative embodiment, the memory device 1220 is above the interconnect structure 302. In embodiments memory device 1220 includes a filamentary based resistive random access memory (RRAM) device, where the RRAM device includes a switching layer and an oxygen exchange layer between a pair of electrodes where a lower most electrode is in contact with the interconnect structure 302. In other embodiments, the memory device 1220 includes a magnetic tunnel junction (MTJ) device that includes a free magnet and a fixed magnet and a MgO tunnel barrier in between. The MTJ device may further include one or more pinning layers and barrier layers between the fixed magnet and the interconnect structure 302.

In other embodiments, one or more layers of interconnects exist between conductive interconnect 506 and the drain contact 1214. The memory device 1220 is also electrically coupled with a conductive interconnect 1222. The conductive interconnect 1222 includes a liner layer 1222A and a fill metal 1222B. In embodiments, the liner layer 1222A and fill metal include materials that are the same or substantially the same as the material of the metallic liner 508 and fill metal 510 described in association with FIG. 5B.

Referring again to FIG. 12, in an embodiment, the underlying substrate 1202 represents a surface used to manufacture integrated circuits. Suitable substrate 1202 includes a material such as single crystal silicon, polycrystalline silicon and silicon on insulator (SOI), as well as substrates formed of other semiconductor materials. In some embodiments, the substrate 1202 may also include semiconductor materials, metals, dielectrics, dopants, and other materials commonly found in semiconductor substrates.

In an embodiment, the transistor 1201 associated with substrate 1202 are metal-oxide-semiconductor field-effect transistors (MOSFET or simply MOS transistors), fabricated on the substrate 1202. In some embodiments, the transistor 1201 is an access transistor 1201. In various implementations of the disclosure, the transistor 1201 may be planar transistors, nonplanar transistors, or a combination of both. Nonplanar transistors include FinFET transistors such as double-gate transistors and tri-gate transistors.

In some embodiments, gate 1203 includes at least two layers, a gate dielectric layer 1203A and a gate electrode 1203B. The gate dielectric layer 1203A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1203A to improve its quality when a high-k material is used.

The gate electrode 1203B of the access transistor 1201 of substrate 1202 is formed on the gate dielectric layer 1203A and may consist of at least one P-type work function metal or N-type work function metal, depending on whether the transistor is to be a PMOS or an NMOS transistor. In some implementations, the gate electrode 1203B may consist of a stack of two or more metal layers, where one or more metal layers are work function metal layers and at least one metal layer is a conductive fill layer.

For a PMOS transistor, metals that may be used for the gate electrode 1203B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1203B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1203B may consist of one or more U-shaped metal layers formed atop one or more planar, non-U-shaped layers.

The sidewall spacers 1210 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1204 and drain region 1206 are formed within the substrate adjacent to the gate stack of each MOS transistor. The source region 1204 and drain region 1206 are generally formed using either an implantation/diffusion process or an etching/deposition process. In the former process, dopants such as boron, aluminum, antimony, phosphorous, or arsenic may be ion-implanted into the substrate to form the source region 1204 and drain region 1206. An annealing process that activates the dopants and causes them to diffuse further into the substrate typically follows the ion implantation process. In the latter process, the substrate 1202 may first be etched to form recesses at the locations of the source and drain regions. An epitaxial deposition process may then be carried out to fill the recesses with material that is used to fabricate the source region 1204 and drain region 1206. In some implementations, the source region 1204 and drain region 1206 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1204 and drain region 1206 may be formed using one or more alternate semiconductor materials such as germanium or a group III-V material or alloy. And in further embodiments, one or more layers of metal and/or metal alloys may be used to form the source region 1204 and drain region 1206.

In an embodiment, the source contact 1212, the drain contact 1214 and gate contact 1216 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

In an embodiment, the interconnect 1222 includes a liner layer and a fill metal on the liner layer, as shown. In an embodiment, the liner layer includes one or more of Ti, Ta, Ru or Al. The fill metal may include a material such as W or Cu.

The isolation 1208 and dielectric 1218 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 13:
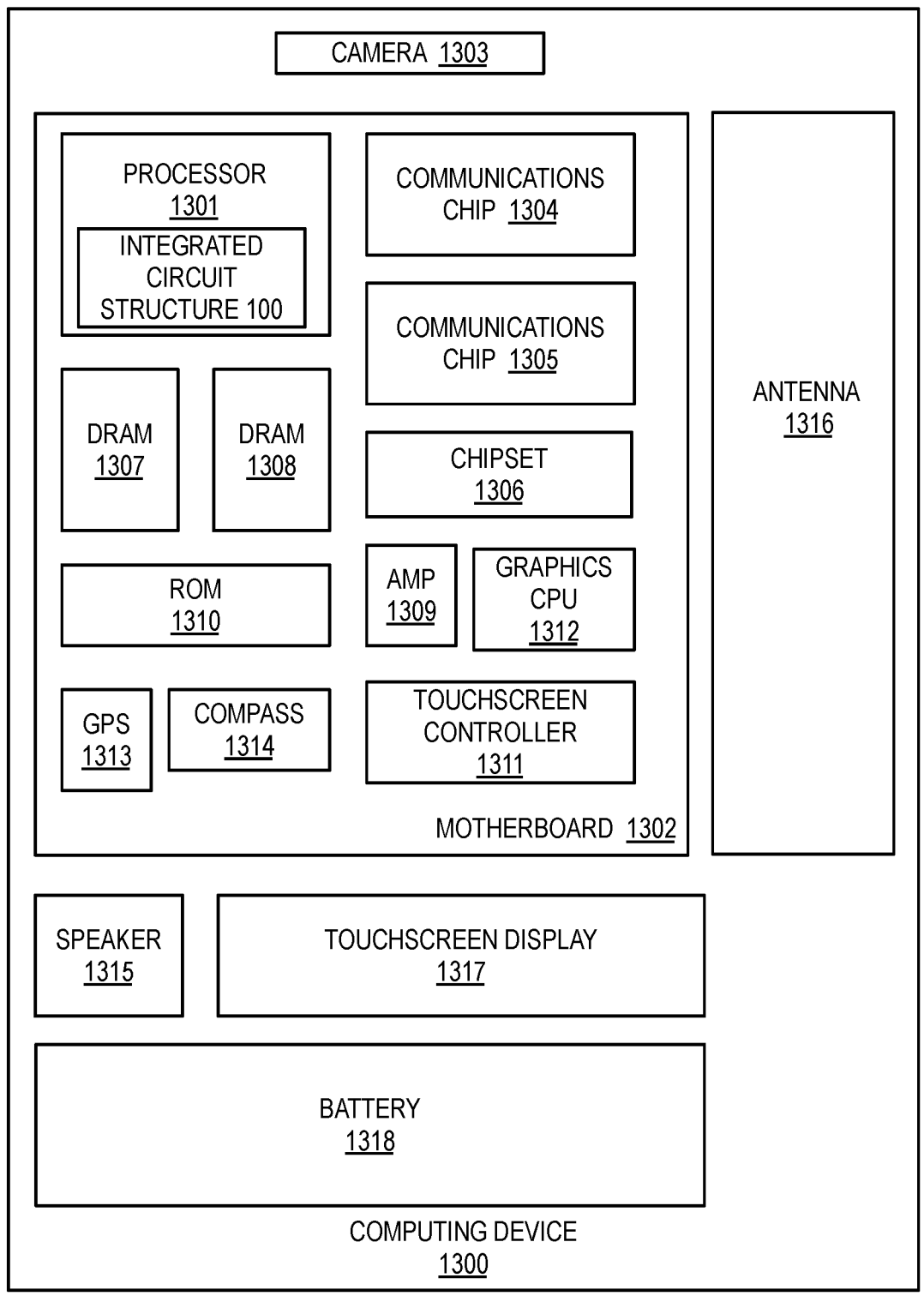
FIG. 13 illustrates a computing device in accordance with embodiments of the present disclosure.

FIG. 13 illustrates a computing device 1300 in accordance with embodiments of the present disclosure. As shown, computing device 1300 houses a motherboard 1302. Motherboard 1302 may include a number of components, including but not limited to a processor 1301 and at least one communications chip 1304 or 1305. Processor 1301 is physically and electrically coupled to the motherboard 1302. In some implementations, communications chip 1305 is also physically and electrically coupled to motherboard 1302. In further implementations, communications chip 1305 is part of processor 1301.

Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset 1306, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1305 enables wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1305 may implement any of a number of wireless standards or protocols, including but not limited to Wi-Fi (IEEE 1301.11 family), WiMAX (IEEE 1301.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1300 may include a plurality of communications chips 1304 and 1305. For instance, a first communications chip 1305 may be dedicated to shorter range wireless communications such as Wi-Fi and Bluetooth and a second communications chip 1304 may be dedicated to longer range wireless communications such as GPS, EDGE, GPRS, CDMA, WiMAX, LTE, Ev-DO, and others.

Processor 1301 of the computing device 1300 includes an integrated circuit die packaged within processor 1301. In some embodiments, the integrated circuit die of processor 1301 includes one or more, non-volatile memory devices, and transistors coupled with capacitors and memory devices and integrated circuit structures such integrated circuit structure 100. The term "processor" may refer to any device or portion of a device that processes electronic data from registers and/or memory to transform that electronic data into other electronic data that may be stored in registers and/or memory.

Communications chip 1305 also includes an integrated circuit die packaged within communication chip 1305. In another embodiment, the integrated circuit die of communications chips 1304, 1305 includes one or more, non-volatile memory devices, and transistors coupled with capacitors and memory devices and integrated circuit structures such integrated circuit structure 100. Depending on its applications, computing device 1300 may include other components that may or may not be physically and electrically coupled to motherboard 1302. These other components may include, but are not limited to, volatile memory (e.g., DRAM) 1307, 1308, non-volatile memory (e.g., ROM) 1310, a graphics CPU 1312, flash memory, global positioning system (GPS) device 1313, compass 1314, a chipset 1306, an antenna 1316, a power amplifier 1309, a touchscreen controller 1311, a touchscreen display 1317, a speaker 1315, a camera 1303, and a battery 1318, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1300 and discussed above may contain a stand-alone integrated circuit memory die that includes one or more arrays of NVM devices.

In various implementations, the computing device 1300 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
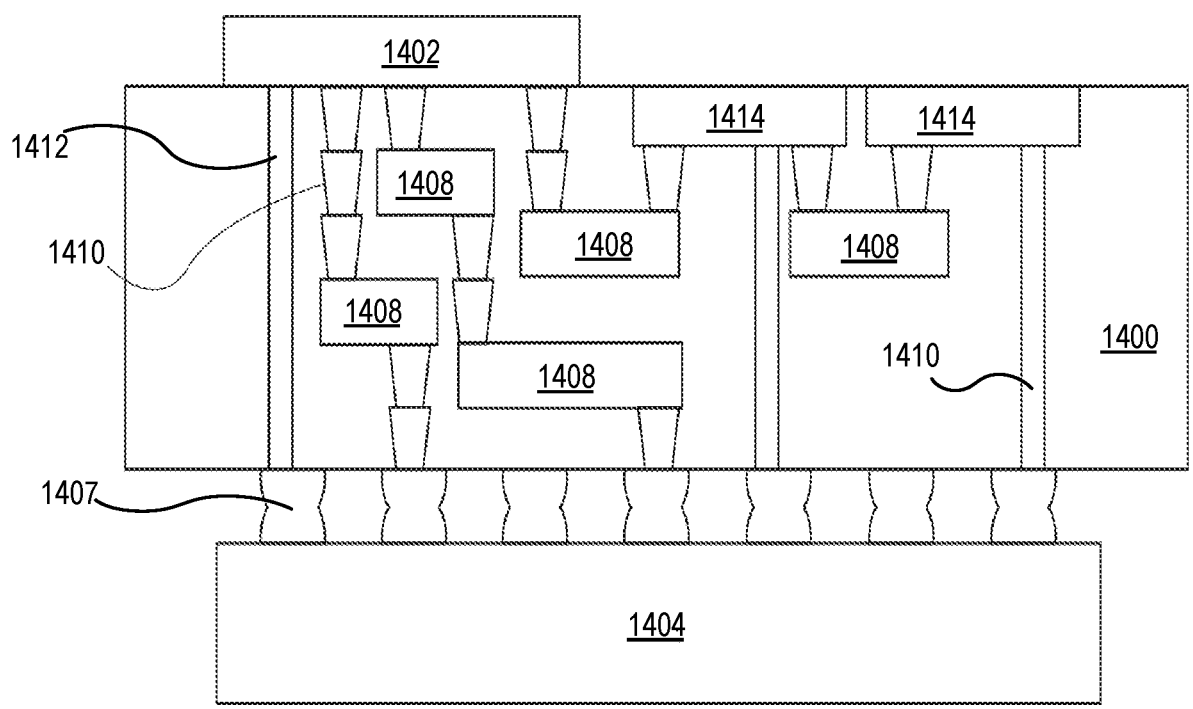
FIG. 14 illustrates an integrated circuit (IC) structure that includes one or more embodiments of the present disclosure.

FIG. 14 illustrates an integrated circuit (IC) structure 1400 that includes one or more embodiments of the disclosure. The integrated circuit (IC) structure 1400 is an intervening substrate used to bridge a first substrate 1402 to a second substrate 1404. The first substrate 1402 may be, for instance, an integrated circuit die. The second substrate 1404 may be, for instance, a memory module, a computer mother, or another integrated circuit die. Generally, the purpose of an integrated circuit (IC) structure 1400 is to spread a connection to a wider pitch or to reroute a connection to a different connection. For example, an integrated circuit (IC) structure 1400 may couple an integrated circuit die to a ball grid array (BGA) 1407 that can subsequently be coupled to the second substrate 1404. In some embodiments, the first substrate 1402 and the second substrate 1404 are attached to opposing sides of the integrated circuit (IC) structure 1400. In other embodiments, the first substrate 1402 and the second substrate 1404 are attached to the same side of the integrated circuit (IC) structure 1400. And in further embodiments, three or more substrates are interconnected by way of the integrated circuit (IC) structure 1400.

The integrated circuit (IC) structure 1400 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1408 and vias 1410, including but not limited to through-silicon vias (TSVs) 1412. The integrated circuit (IC) structure 1400 may further include embedded devices 1414, including both passive and active devices. Such embedded devices 1414 include capacitors, decoupling capacitors one or more transistors coupled with memory devices through integrated circuit structure 100, such as transistor 1201 having one or more features described in association with FIG. 12. Referring again to FIG. 14, the integrated circuit (IC) structure 1400 may further include embedded devices 1414 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1400.

Thus, one or more embodiments of the present disclosure relate to integrated circuit structure including cap structure and a liner between two levels of interconnect structures such as integrated circuit structure 100, 300 as described above. The integrated circuit structure 100 may be used in various integrated circuit applications.

In a first example, an integrated circuit structure includes a first interconnect level including a first dielectric between a pair of interconnect structures and a second interconnect level above the first interconnect level. The second interconnect level includes a cap structure including a second dielectric on the first dielectric, where the cap structure includes a top surface and a sidewall surface. A liner including a third dielectric is on the top surface and on the sidewall surface.

In second examples, for any of first examples, the first dielectric includes silicon, oxygen and less than 1 atomic percent of carbon and the second dielectric includes silicon and oxygen.

In third examples, for any of the first through second examples, the second dielectric further includes less than 1 atomic percent of aluminum.

In fourth examples, for any of the first through third examples, the third dielectric includes oxygen and one of aluminum, hafnium, zirconium or titanium and where the liner has thickness between 0.7 nm and 2 nm.

In fifth examples, for any of the first through fourth examples, liner is in contact with uppermost surfaces of individual ones of the pair of interconnect structures.

In sixth examples, for any of the first through fifth examples, the second dielectric has a vertical thickness as measured from an uppermost surface of the first dielectric, where the vertical thickness is between 3 nm and 6 nm In seventh examples, for any of the first through sixth examples, the cap structure extends onto uppermost surfaces of individual ones of the pair of interconnect structures, and where the liner is in contact with an uppermost surface of each interconnect.

In eighth examples, for any of the first through seventh examples, the cap structure has a first lateral thickness, where the liner has a second lateral thickness, and where the first dielectric has a third lateral thickness and where the third lateral thickness is equal to a combined sum of the first lateral thickness and two times a sum of the second lateral thickness In ninth examples, for any of the first through eight examples, the first pair of interconnect structures includes a conductive liner adjacent the first dielectric and a fill metal on the conductive liner and where liner is over the conductive liner.

In tenth examples, for any of the first through ninth examples, the pair of interconnect structures is a first pair of interconnect structures and the second interconnect level further includes a second pair of interconnect structures, where individual ones of the second pair of interconnect structures is on at least a portion of a corresponding individual ones of the first pair of interconnect structures. An etch stop layer including a fourth dielectric is on least a portion of the liner and a fifth dielectric is on the etch stop layer and between the pair of second interconnect structures.

In eleventh examples, for any of the first through tenth examples, the liner is in contact with the first pair of interconnect structures and the second pair of interconnect structures.

In twelfth examples, for any of the first through eleventh examples, the etch stop layer is between the liner and the fifth dielectric, but not between the liner and second pair of interconnect structures.

In thirteenth examples, for any of the first through twelfth examples, the liner includes a first portion between the cap structure and the etch stop layer and a second portion between the cap structure and at least one interconnect structure in the second pair of interconnect structures, where the first portion includes a first thickness and the second portion includes a second thickness and where the second thickness is less than the first thickness.

In a fourteenth example, for any of the first through thirteenth examples, the etch stop layer is between an individual one of the second pair of interconnect structures and the fifth dielectric.

In fifteenth example, a method of forming an integrated circuit structure includes receiving a workpiece including a first dielectric between a pair of interconnects. The method further includes passivating uppermost surfaces of the individual ones of the pair of interconnects by selectively forming a passivation layer on the uppermost surfaces but not on the first dielectric and selectively growing a second dielectric on the first dielectric. The method further includes selectively growing a liner on the second dielectric but not on the uppermost surfaces of the individual ones of the pair of interconnects and removing the passivation layer.

In sixteenth examples, for any of the fifteenth examples, forming the passivation layer includes forming the passivation layer on a fill metal of the individual ones of the pair of interconnects but not on a metallic liner laterally between the first dielectric and the fill metal.

In seventeenth examples, for any of the fifteenth through sixteenth examples, depositing the second dielectric includes depositing the second dielectric on the first dielectric and not on the metallic liner.

In eighteenth examples, for any of the fifteenth through seventeenth examples, growing the liner includes growing the liner on sidewalls of the second dielectric and over the metallic liner, but not in contact with the metallic liner.

In nineteenth example, a system includes a processor, a radio transceiver coupled to the processor, where the transceiver includes a transistor. The transistor includes a drain contact coupled to a drain, a source contact coupled to a source and a gate contact coupled to a gate. An integrated circuit structure is coupled with the drain contact. The integrated circuit structure includes a first interconnect level including a first dielectric between a pair of interconnect structures and a second interconnect level above the first interconnect level. The second interconnect level includes a cap structure including a second dielectric on the first dielectric, where the cap structure includes a top surface and a sidewall surface. A liner including a third dielectric is on the top surface and on the sidewall surface. The integrated circuit structure further includes a second interconnect structure on at least a portion of the first interconnect structure, an etch stop layer including a fourth dielectric on least a portion of the liner, and a fifth dielectric on the etch stop layer and adjacent the second interconnect structure. A memory device is coupled with the second interconnect structure.

In twentieth example, for any of the twenty first examples, system further includes a battery and an antenna coupled with the transistor, and where the memory device is a resistive random access memory device or a magnetic tunnel junction device.

What is claimed is:

1. An integrated circuit structure, comprising:
   a first interconnect level comprising a first dielectric between a pair of interconnect structures comprising uppermost surfaces; and
   a second interconnect level above the first interconnect level, the second interconnect level comprising:
   a cap structure comprising a second dielectric over the first dielectric, the cap structure comprising a top surface and a sidewall surface;
   a liner comprising a third dielectric on the top surface and on the sidewall surface, but absent from at least a portion of the uppermost surfaces; and
   a fourth dielectric over at least a portion of the liner and over the portion of the uppermost surfaces.

2. The integrated circuit structure of claim 1, wherein the first dielectric comprises silicon, oxygen and a trace amount of less than 1 atomic percent of carbon, and wherein the second dielectric comprises silicon and oxygen.

3. The integrated circuit structure of claim 2, wherein the second dielectric further comprises a trace amount of less than 1 atomic percent of aluminum.

4. The integrated circuit structure of claim 1, wherein the third dielectric comprises oxygen and one of aluminum, hafnium, zirconium or titanium and wherein the liner has thickness between 0.7 nm and 2 nm.

5. The integrated circuit structure of claim 1, wherein the liner is in contact with at least a second portion of the uppermost surfaces of individual ones of the pair of interconnect structures.

6. The integrated circuit structure of claim 1, wherein the second dielectric has a vertical thickness as measured from an uppermost surface of the first dielectric, wherein the vertical thickness is between 3 nm and 6 nm.

7. The integrated circuit structure of claim 1, wherein the cap structure extends onto at least a second portion of the uppermost surfaces of individual ones of the pair of interconnect structures, and wherein the liner is in contact with an uppermost surface of each interconnect.

8. The integrated circuit structure of claim 1, wherein the cap structure has a first lateral thickness, wherein the liner has a second lateral thickness, and wherein the first dielectric has a third lateral thickness and wherein the third lateral thickness is equal to a combined sum of the first lateral thickness and two times a sum of the second lateral thickness.

9. The integrated circuit structure of claim 1, wherein each of the pair of interconnect structures comprises a conductive liner adjacent the first dielectric and a fill metal on the conductive liner, and wherein the liner is over the conductive liner.

10. The integrated circuit structure of claim 1, wherein the pair of interconnect structures is a first pair of interconnect structures and the second interconnect level further comprises:
   a second pair of interconnect structures, wherein at least one of the second pair of interconnect structures is on at least some portion of a corresponding one of the first pair of interconnect structures; and
   a fifth dielectric on the fourth dielectric and between the pair of second interconnect structures.

11. The integrated circuit structure of claim 10, wherein a portion of the liner is in contact with the first pair of interconnect structures and the second pair of interconnect structures.

12. The integrated circuit structure of claim 10, wherein the fourth dielectric is between the liner and the fifth dielectric, but not between the liner and the second pair of interconnect structures.

13. The integrated circuit structure of claim 10, wherein the liner comprises a first portion between the cap structure and the fourth dielectric and a second portion between the cap structure and at least one interconnect structure in the second pair of interconnect structures, wherein the first portion of the liner comprises a first thickness and the second portion of the liner comprises a second thickness and wherein the second thickness is less than the first thickness.

14. The integrated circuit structure of claim 10, wherein the fourth dielectric is between one of the second pair of interconnect structures and the fifth dielectric.

15. The integrated circuit structure of claim 1, wherein the fourth dielectric is in direct contact with the portion of the uppermost surfaces.

16. A system comprising:
   a processor;
   a radio transceiver coupled to the processor, wherein the transceiver includes a transistor comprising:
      a drain contact coupled to a drain;
      a source contact coupled to a source; and
      a gate contact coupled to a gate; and
   an integrated circuit structure coupled with the drain contact, the integrated circuit structure comprising:
      a first interconnect level comprising, a first dielectric adjacent a first interconnect structure;
      a second interconnect level above the first interconnect level, the second interconnect level comprising:
         a cap structure comprising a second dielectric on the first dielectric, the cap structure comprising a top surface and a sidewall surface;
         a liner comprising a third dielectric on the top surface and on the sidewall surface, but absent from at least a first portion of the first interconnect structure;
         a second interconnect structure on at least a second portion of the first;
         an etch stop layer comprising a fourth dielectric on least a portion of the liner and over at least the first portion of the first interconnect structure; and
         and a fifth dielectric on the etch stop layer and adjacent the second interconnect structure; and
      a memory device coupled with the second interconnect structure.

17. The system of claim 16, further comprises a battery and an antenna coupled with the transistor, and wherein the memory device is a resistive random access memory device or a magnetic tunnel junction device.

18. The system of claim 16, wherein the fourth dielectric is in direct contact with the first portion of the first interconnect structure.

19. An apparatus, comprising:
   a first interconnect level comprising a first dielectric between a pair of first interconnect structures; and
   a second interconnect level above the first interconnect level, the second interconnect level comprising:
      a cap structure comprising a second dielectric over the first dielectric, the cap structure comprising a top surface and a sidewall surface;
      a liner comprising a third dielectric on the top surface and on the sidewall surface;
      a fourth dielectric on least a portion of the liner;
      a fifth dielectric on the fourth dielectric and between a pair of second interconnect structures, wherein the fourth dielectric is between the liner and the fifth dielectric, but not between the liner and second pair of interconnect structures.

20. The apparatus of claim 19, wherein the liner comprises a first portion between the cap structure and the fourth dielectric and a second portion between the cap structure and at least one of the second pair of interconnect structures, wherein the first portion comprises a first thickness and the second portion comprises a second thickness and wherein the second thickness is less than the first thickness.

* * * * *